(12) United States Patent
Miller

(10) Patent No.: US 6,382,494 B1
(45) Date of Patent: May 7, 2002

(54) AUTOMATIC ULTRASONIC BONDING MACHINE WITH VERTICALLY TIERED ORTHOGONALLY TRANSLATABLE TOOL SUPPORT PLATFORMS

(75) Inventor: Charles F. Miller, Anaheim Hills, CA (US)

(73) Assignee: West Bond, Inc., Anaheim, CA (US)

(*) Notice: Subject to any disclaimer, the term of this patent is extended or adjusted under 35 U.S.C. 154(b) by 0 days.

(21) Appl. No.: 09/570,196

(22) Filed: May 12, 2000

(51) Int. Cl.[7] ................................................ B23K 1/06
(52) U.S. Cl. ........................ 228/1.1; 228/4.5; 228/110.1
(58) Field of Search ............................... 228/180.5, 4.5, 228/1.1, 110.1; 29/739

(56) References Cited

U.S. PATENT DOCUMENTS

| | | | | |
|---|---|---|---|---|
| 3,474,685 A | * | 10/1969 | Miller | |
| 3,626,590 A | * | 12/1971 | Miller | |
| 3,773,240 A | * | 11/1973 | Heim | |
| 3,941,294 A | * | 3/1976 | Johannsmeier | |
| 4,475,681 A | * | 10/1984 | Ingle | |
| 5,702,049 A | * | 12/1997 | Biggs et al. | |
| 5,871,136 A | * | 2/1999 | Miller | |
| 5,897,048 A | * | 4/1999 | Cheng et al. | |
| 6,102,275 A | * | 8/2000 | Hill et al. | |
| 6,109,501 A | * | 8/2000 | Cheng et al. | |
| 6,164,514 A | * | 12/2000 | Miller | |
| 6,196,445 B1 | * | 3/2001 | Fogal et al. | |

* cited by examiner

Primary Examiner—Tom Dunn
Assistant Examiner—Colleen P. Cooke
(74) Attorney, Agent, or Firm—William L. Chapin

(57) ABSTRACT

A machine for automatically making ultrasonic bonds between metallic conductors using a metal bonding wire precisely positions the tip of an ultrasonic bonding tool relative to a workpiece with a positioning mechanism which includes a first, upper tool support platform rollably supported by a support structure and translatable in a first direction with respect to the support structure by a first remotely operable drive motor, at least a second tool support platform rollably supported by the first tool support platform and translatable with respect thereto in a second direction by a second drive motor, and preferably, a third, end tool support platform rollably supported by the second tool support platform and translatable with respect thereto by a third drive motor.

26 Claims, 23 Drawing Sheets

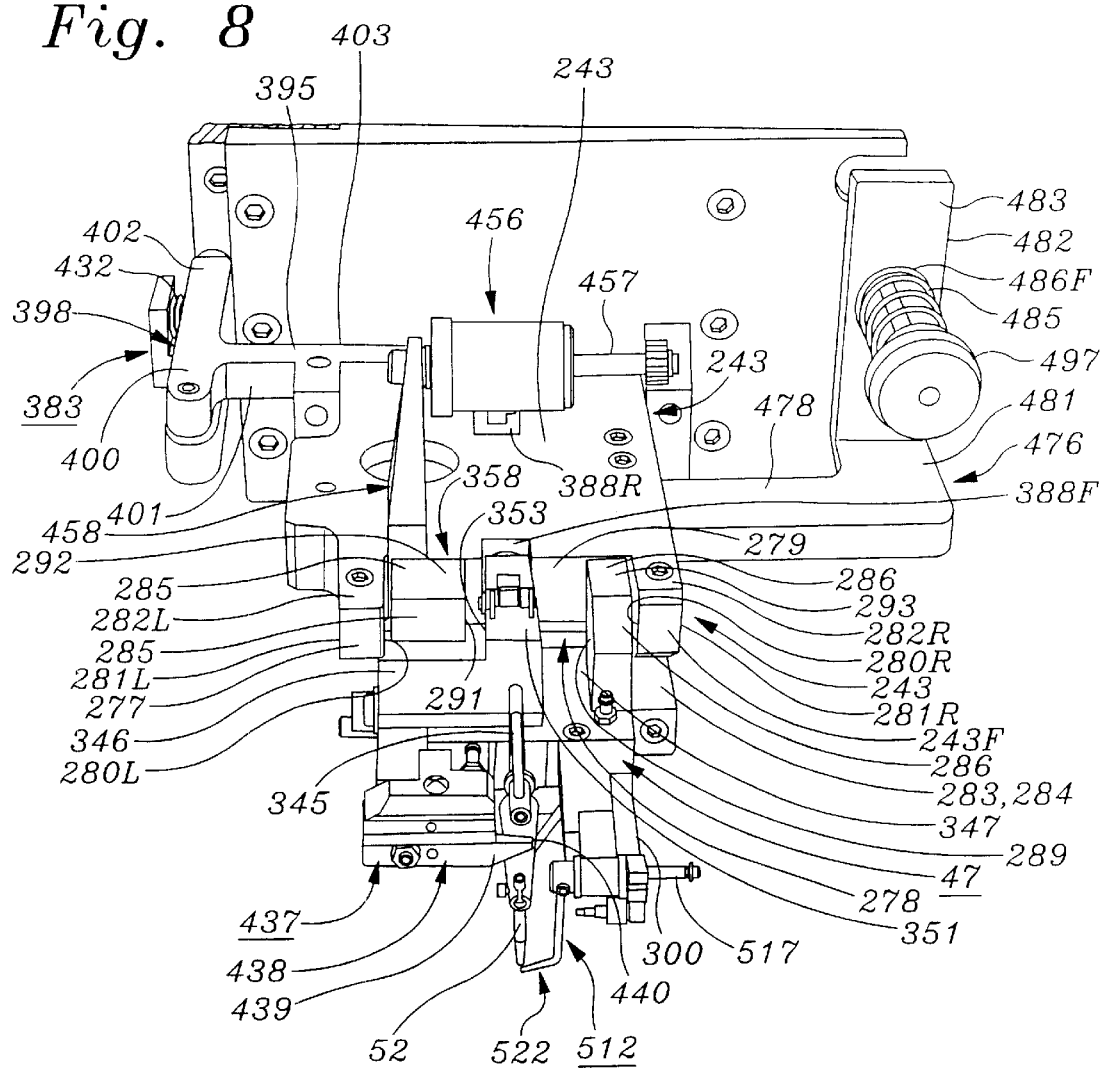
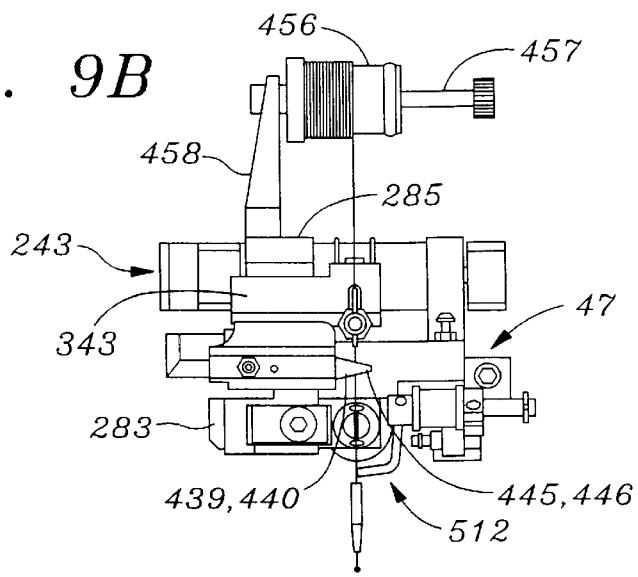

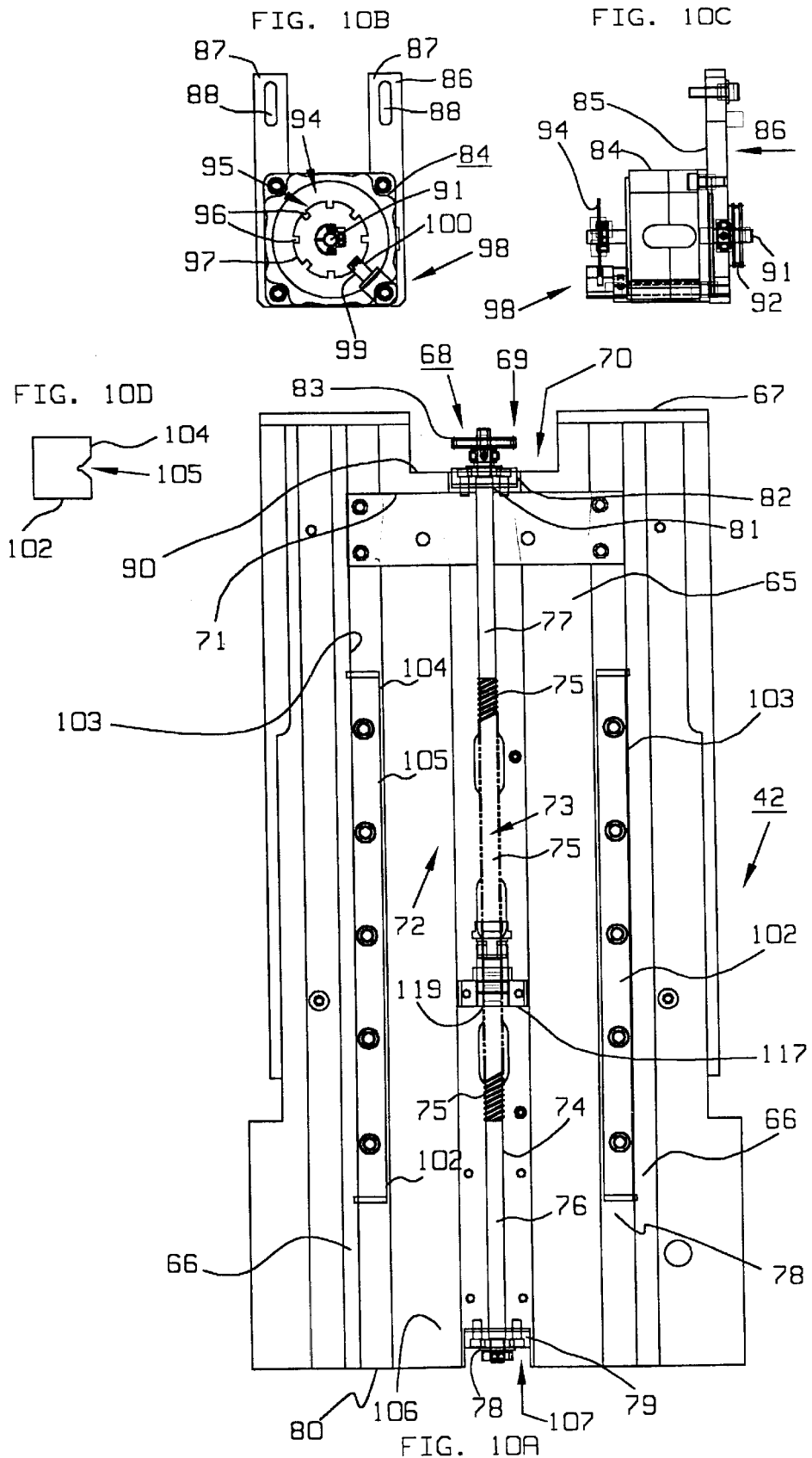

AUTOMATIC ULTRASONIC BONDING MACHINE WITH VERTICALLY TIERED ORTHOGONALLY TRANSLATABLE TOOL SUPPORT PLATFORMS

BACKGROUND OF THE INVENTION

A. Field of the Invention

The present invention relates to machines and apparatus for forming ultrasonic wire bonds on miniature workpieces such as microcircuits and read/write heads of the type used to read and write data from and to disk memories. More particularly, the invention relates to an automatic ultrasonic bonding machine having an ultrasonic bonding tool which protrudes downwardly from a vertically tiered stack of orthogonally translatable tool support platforms, each having a separate motor drive, which when driven by computer generated command signals, automatically translates the tool in three dimensional space to thus position a wire end protruding from the tool tip at precisely pre-determined locations on a workpiece and form ultrasonic bonds at those locations by energizing an ultrasonic transducer rigidly coupled to the upper end of the tool.

B. Description of Background Art

A large variety of scientific procedures, medical procedures and industrial processes require the use of a type of apparatus referred to generally as a micro-manipulator for the precise positioning of a tip of a tool or instrument relative to a small workpiece or other such object. For example, the manufacture of electronic components such as integrated or hybrid microcircuits requires the use of a micro-manipulator-type apparatus, for the following reasons.

Integrated circuits are fabricated from thin slices of a semi-conducting material such as silicon, germanion, or from gallium arsenide or other III-V compounds, i.e., compounds of elements from columns three and five of the periodic table. The slices are cut into small squares or rectangles referred to as chips or dice, ranging in size from squares about 100 mil (0.100 inch) on a side to several hundred mils. Transistors, diodes, resistors and interconnecting circuit paths are formed on each chip or die by diffusing impurities into selected regions of the die to produce a desired electrical conductivity. Various conducting paths and insulated layers are then deposited on the chip.

After a semi-conductor chip or die has been fabricated as described above, it must be attached to a base or carrier. A lid is then sealed to the base to form a package or container which protects the delicate die from damage. Prior to attaching the lid to the carrier which supports the die, conductive pads which provide input and output conductive paths to the die must be electrically interconnected to more robust leads or terminals which extend outward from the carrier. These interconnections are customarily made using fine aluminum or gold wires. The wires are ultrasonically or thermo-sonically welded to the pads and external leads by a bonding tool that applies ultrasonic energy, or a combination of heat and ultrasonic energy, to a bonding site. Since the connection pads of a microcircuit are extremely tiny and closely spaced, great precision is required in positioning the tip of a bonding tool relative to the microcircuit.

Responsive to the need for an apparatus capable of precisely positioning the tip of an ultrasonic transducer to form wire bonds on microcircuit chips, the present inventor invented a micro-positioner apparatus which employs a novel pantograph-type manipulator input mechanism. That apparatus, which was disclosed in the present inventor's U.S. Pat. No. 3,474,685 and issued on Oct. 28, 1969, has proven to be highly effective in performing its intended functions, and wire bonding machines employing the novel design concepts including the pantograph mechanism disclosed in that patent are widely used throughout the electronics industry. However, the present inventor found that certain aspects of the micro-positioner disclosed in the 3,474,685 patent might be improved upon. For example, the allowable working or throat depth of the ultrasonic tool tip would preferably be larger for certain bonding applications. Also, the use of offset pivotable mountings for the transducer tool support plate would desirably be minimized, thereby minimizing the requirement for springs to counter balance unbalanced forces exerted in supporting the tool support plate by offset mountings. Moreover, it would be desirable to have a micro-positioner apparatus in which various ultrasonic transducers and other bonding tool accessories such as wire spooling mechanisms, some of which might be substantially heavier than conveniently supportable by prior art micro-positioners, could be used. Such a need arises, for example, in bonding tie heavier wires required for connection to certain electronic components such as wound coils and disk drive components. In response to those considerations, the present inventor disclosed a Micro-positioner For Ultrasonic Bonding, U.S. patent application Ser. No. 08/773,637 filed Dec. 24, 1996, now U.S. Pat. No. 5,871,136. In that patent the present inventor disclosed a micro-positioner apparatus having a pantograph-like input manipulator mechanism, and a follower mechanism coupled to the input manipulator mechanism by a ball joint and supporting an ultrasonic transducer housing and bonding tool on a tool support plate. The tool support plate is longitudinally slidably mounted on a tool support guide plate, allowing fore and aft motion of the tool tip. The tool support guide plate is in turn pivotably supported by a yoke having a yaw pivot bearing which allows lateral motion of the tool tip. The yoke is in turn supported by a pitch pivot bearing having a horizontally disposed pivot axis, thereby permitting pivotal motion in a vertical plane of the yoke, tool support plate, and tool tip. By a suitable choice of spacings between the pivot axes of the pantograph input manipulator mechanism, support bearings and ball joint, the tip of the bonding tool is caused to move in coordinate directions of a second coordinate system containing the tool tip in precisely scaled ratios of corresponding motions in a first coordinate system of an input control knob on the input manipulator mechanism. The combination of a longitudinally slidable tool support plate with two pivot bearings orthogonal to each other and to the platform axis, provides a micropositioner apparatus which has both a rugged construction capable of supporting heavy loads on the tool support plate, and a substantial throat depth. In a preferred embodiment of the disclosed apparatus, the longitudinal platform axis of the tool tip, and the pivot axes of the pitch and yaw pivot bearings all intersect at a common point, thereby assuring completely orthogonal motions of the tool tip in three orthogonal coordinate directions that are precisely scaled fractions of corresponding input control knob motions.

In U.S. patent application Ser. No. 09/153,206, filed Sep. 15, 1998, now U.S. Pat. No. 6,164,514, the present inventor disclosed a micro-manipulator for ultrasonic bonding applications having a manipulator input mechanism and tool holder follower mechanism which are both pendent from an overlying support structure, thereby affording a work space of potentially unlimited lateral extent below the apparatus. Among other advantages, the large work space can accommodate workpieces located on a conveyor belt disposed below the apparatus.

The micro-manipulator apparatus disclosed in the pending application identified above provides means for dynamically positioning an implement relative to a workpiece, particularly an ultrasonic bonding tool tip relative to a miniature electronic component, moving the tool tip into contact with a selected bonding site to permit formation of a bond by application of ultrasonic energy to the bonding site, and withdrawing the tip upon completion of the bond. A preferred embodiment of a micro-manipulator apparatus according to the prior invention disclosed in the pending application includes a manually operable manipulator input mechanism coupled by means of a ball joint to a follower mechanism which includes a tool support structure for holding an ultrasonic bonding tool or similar implement. Position commands input to the manipulator input mechanism, as for example, by human manipulation of a control knob comprising an input element of the mechanism, are coupled to the follower mechanism, resulting in motions of the tool tip that are precisely scaled fractions of the input position commands. According to the prior invention, motions of an input member of the manipulator mechanism in an input coordinate system effect precisely ratioed motions of a tool tip in an output follower coordinate system. The apparatus according to the prior invention could have as few as one degree of freedom for both the input and output follower coordinate systems. Preferably, however, the input manipulator had three degrees of translational freedom along three orthogonal coordinate axes of an input coordinate system, resulting in translational motions of a tool tip along three orthogonal axes of the output follower coordinate system.

According to one aspect of the prior invention, the follower mechanism is mounted to a support structure by means of at least two mutually orthogonally disposed linear bearing sets, one set for each degree of tool-tip freedom. In a preferred embodiment of the prior invention, a primary bearing platform structure is linearly movably fastened to a vertical support structure by means of first linear bearing means, a secondary or intermediate bearing platform structure is linearly movably fastened to the primary bearing platform structure by second linear bearing means having a line of action orthogonal to that of the first linear bearing means, and a tertiary bearing platform structure is linearly movably fastened to the secondary platform support structure by third linear bearing means having a line of action orthogonal to those of both the first and second bearing means. A tool such as an ultrasonic bonding tool is fastened to the third bearing platform structure, which thus comprises a tool support member.

In a preferred embodiment of the prior invention, three bearing support platform structures forming a cascaded series are used, with the primary bearing platform structure being vertically movably fastened to a vertical support structure wall by a pair of parallel, longitudinally opposed, vertically disposed linear roller bearings. The secondary or intermediate bearing support platform structure is laterally movably fastened to the underside of a laterally outwardly protruding, horizontally disposed leg of the primary bearing platform structure by a pair of parallel, longitudinally opposed, laterally disposed roller bearings. The tertiary, tool-support bearing support platform structure is longitudinally slidably fastened to the underside of the intermediate platform support by a pair of parallel, laterally opposed, longitudinally disposed linear roller bearings.

Also in the preferred embodiment of the prior invention, the tool support platform is horizontally disposed, movable in a fore and aft, longitudinal direction and supports near the front longitudinal end thereof an ultrasonic force transducer having a downwardly depending tool tip for contacting a workpiece such as an electronic microcircuit.

According to the prior invention, the manipulator input mechanism is located to the rear of and at a higher elevation than the follower mechanism, and is coupled to the follower mechanism by a ball joint. The ball joint includes a ball which protrudes upwardly from the rear longitudinal end of the tool support platform and a socket which protrudes downwardly from a manipulator input mechanism cross member. With this construction, the lowest component surface of the apparatus may be the bottom surface of the tool support platform. Since the tool support platform is coupled through overlying cascaded bearing support platform structures to a support structure at a location at a higher elevation than the tool support platform, a work space of potentially unlimited lateral extent is provided beneath the apparatus.

Preferably, an ultrasonic transducer of the prior invention is resiliently fastened to the tool support platform, allowing the transducer and tool tip to move upwards when the tip is moved downwards into contact with a bonding site, thereby limiting the downward force exerted by the tip on the bonding site. As disclosed in the prior application, resilient upward displacement of the transducer may also be used to activate a switch connected to control circuitry which inputs a pulse of current of pre-determined duration to the transducer. By including a four-bar linkage between the tool support plate and resilient transducer mounting resilient displacements of the tool tip are constrained to occur only in a vertical direction.

The micro manipulator disclosed in the present inventor's pending application No. '206 provides a highly satisfactory solution to the problem of efficiently forming ultrasonic bonds on workpieces requiring a large clearance space below the line of action of a manually controlled ultrasonic bonding tool, such as workpieces located on a conveyor belt. However, the problem of making a sequence of ultrasonic bonds at precisely pre-determined locations on tiny workpieces located on moving conveyor belts still remained. For example, the manufacture of read/write heads used in magnetic disk memories requires the formation of permanent electrical connections between conductive pads on a surface of a tiny magnetic field sensing chip located at the outer end of support member referred to as a slider, and conductors in the form of conductive strips disposed inwardly along the surface of the slider to electrical terminals which are used to connect the head to read//write circuitry of disk drive electronics.

The conductive pads on the magnetic field sensor chip are typically located on a side of the chip disposed perpendicularly outwardly from the conductive strips on the surface of the platforms. Thus, bonds between each slider conductor and an adjacent sensor chip pad are, according to one technique, made by first applying a flame or an electrical arc discharge to the end of a fine wire protruding from the bore of an ultrasonic ball-bonding tool to melt the wire, which upon cooling resolidifies into a fusion ball. The tool and ball are then moved along a line action directed diagonally into a corner formed between the surface of the sensor chip and the slider until the ball contacts both the chip pad and adjacent slider conductor. Ultrasonic energy is then applied through the tip of the tool to the ball, welding the ball to both the chip pad and slider conductor. The bonding tool is then retracted from the bond site, and the wire grasped by mechanical jaws and pulled to break the wire at the bond site. Another fusion ball is then formed at the broken end of the wire protruding from the tool, and the tool tip and wire again moved diagonally into the corner defined between the upper surface of the slider and the adjacent transverse surface of the sensor chip to form the second and any other subsequent bonds required for the read/write head. This method of ultrasonically bonding conductive elements of read/write heads for magnetic memories is understandably referred to as "ball-in-the-corner" bonding.

Because of the extremely small size and perpendicular orientation of the surfaces of conductive pads to be bonded, ball-in-the-corner bonding requires a bonding tool to be positioned with extreme accuracy relative to the workpiece. Moreover, the prodigious volumes of read/write heads required by the computer industry virtually dictates that such bonds be made at high production rates, e.g., on an assembly line in which the heads are transported via a conveyor belt to and from an ultrasonic bonding machine. Since the design of presently used ultrasonic bonding machines results in a relative limited work space being available beneath the bonding tool tip, read/write heads on which ball-in-the-corner bonds are to be made must be individually removed from a conveyor belt and transported to a bonding machine for bonding. Thus, a problem with bonding methods using currently available bonding machines is the interruption of assembly line work flow, specifically the interruption of transport of parts by conveyor through assembly line work stations. This interruption is caused by the requirement for removing workpieces from the conveyor belt for bonding, and returning them to the conveyor belt after completion of the bonding process. Accordingly, it would be desirable to provide a bonding machine which could make ultrasonic bonds on workpieces while they remain on a conveyor belt, without having to remove the workpieces from the conveyor belt. In particular, to maximize the throughput rate of ultrasonic bonding on large quantities of small workpieces, it would be desirable to provide an ultrasonic bonding machine which could make bonds on individual workpieces located in longitudinally spaced apart rows of workpieces arranged transversely across the surface of a conveyor belt, motion of the belt being halted during formation of bonds on the row of workpieces. Accordingly, the present invention was conceived of to provide an ultrasonic bonding machine for automatically moving the tip of an ultrasonic wire bonding tool into contact with a sequence of precisely pre-determinable locations of a workpiece, and forming a sequence of ultrasonic bonds at those locations at high rates.

OBJECTS OF THE INVENTION

An object of the present invention is to provide a machine for automatically positioning an ultrasonic bonding tool at precisely pre-determined locations relative to a workpiece, and forming ultrasonic bonds at those locations.

Another object of the invention is to provide an automatic ultrasonic bonding machine for automatically moving the tip of an ultrasonic bonding tool to contact pre-determined locations of a workpiece and forming ultrasonic bonds thereat.

Another object of the invention is to provide an automatic ultrasonic bonding machine which employs a cascaded stack of orthogonally translatable support platforms to translate a tip of an ultrasonic bonding tool protruding downwardly from the stack relative to a workpiece located below the tool tip.

Another object of the invention is to provide an ultrasonic bonding machine including an upper support member, and a stack of orthogonally translatable support platforms which depend downwardly from the upper support member, each of the support platforms being drivable by a separate actuator motor under automatic control to a precisely pre-determined location relative to a workpiece located below an ultrasonic bonding tool which protrudes downwardly from the end tool support platform of the stack.

Another object of the invention is to provide an automatic ultrasonic bonding machine which includes an ultrasonic tool having a central longitudinally disposed bore for receiving a length of bonding wire, a pair of opposed clamp jaws above the bonding tool for grasping the bonding wire and pulling the wire to break it off at a bond site, a drag tube including a radiused capillary bore for frictionally resisting motion of a bonding wire supplied from a spool through the tube, pivot actuator means for pivoting the clamp jaws and drag tube to thereby extend the broken end of the wire a precisely pre-determined distance below the lower end of the bonding tool tip, and an electric flame-off torch pivotable to a position below the broken end of the bonding wire to form thereat a fusion ball of pre-determined characteristics.

Another object of the invention is to provide an automatic ultrasonic bonding machine including a first, upper Y-axis tool support platform rollably supported underneath a fixed support structure, a second, X-axis tool support platform rollably supported underneath the Y-axis tool support platform, a third, Z-axis tool support platform rollably supported at the front of the Y-axis tool support platform, a rear transducer mount support plate pivotably mounted to the front of the Z-axis tool support platform, a transducer mount assembly pivotably mounted to the front of the rear transducer mount support assembly, and a clamp/feed tube/drag tube assembly pivotably mounted to the upper surface of the transducer mount assembly.

Various other objects and advantages of the present invention, and its most novel features, will become apparent to those skilled in the art by perusing the accompanying specification, drawings and claims.

It is to be understood that although the invention disclosed herein is fully capable of achieving the objects and providing the advantages described, the characteristics of the invention described herein are merely illustrative of the preferred embodiments. Accordingly, I do not intend that the scope of my exclusive rights and privileges in the invention be limited to details of the embodiments described. I do intend that equivalents, adaptations and modifications of the invention reasonably inferable from the description contained herein be included within the scope of the invention as defined by the appended claims.

SUMMARY OF THE INVENTION

Briefly stated, the present invention comprehends an automatic ultrasonic bonding machine for automatically forming ultrasonic wire bonds at a sequence of pre-determined locations of a workpiece at high throughput rates.

An automatic ultrasonic bonding machine according to the present invention includes an upper support plate fastenable to an overlying support structure which may be located above a conveyor belt, for example. The automatic ultrasonic bonding machine according to the present invention includes a positioning mechanism for moving the tip of an ultrasonic bonding tool by drive motors to precisely pre-determinable positions within a three-dimensional coordinate space containing a workpiece, e.g., in X-Y directions parallel to the workpiece, and in a third coordinate direction, e.g., the Z-direction downwardly to contact a bond site on a workpiece with the tool tip and form thereat an ultrasonic bond, and upwardly to withdraw the tip from the bond site. The positioning mechanism includes a generally downwardly tiered stack of tool support platforms comprising a first, upper, Y-axis tool support platform translatable horizontally in a first, Y-direction with respect to an overlying support plate, a second, X-axis tool support platform located below the Y-axis tool support platform and translatable horizontally in a second, X-direction relative to the Y platform, and a third, Z-axis tool support platform located in front of the X-axis tool support platform and translatable in a Z-direction relative to the X-axis platform.

The first, upper translatable tool support platform of the positioning mechanism is rollably attached to the lower surface of the upper support plate by a first pair of laterally opposed, parallel linear roller bearings which enable linear motion of the upper tool support platform in a first direction parallel to a work surface, e.g., in a "Y" direction parallel to the surface of a conveyor belt located below the machine, and longitudinally or perpendicularly disposed to the conveyor belt travel direction. The positioning mechanism also preferably includes a second, intermediate translatable tool support platform linearly rollably attached to the lower surface of the upper translatable tool support platform by a second pair of longitudinally opposed, i.e., front and rear, parallel linear roller bearings. The latter bearing pair enables linear motion of the intermediate tool support platform in a second direction, perpendicular to the first translatable direction, e.g., in an "X" direction parallel to a conveyor belt travel direction.

The positioning mechanism of the automatic ultrasonic bonding machine according to the present invention also includes a third, front translatable tool support platform linearly rollably attached to the front surface of the intermediate translatable tool support platform by a third pair of laterally opposed, vertically disposed parallel linear roller bearings. The latter bearing set enables linear motion of the front tool support platform in a third coordinate direction perpendicular to the first and second translating directions of the first and second tool support platforms, i.e., in a "Z" direction perpendicular to a workpiece support surface such as a conveyor belt.

A preferred embodiment of an automatic wire bonding machine according to the present invention includes a rear generally horizontally disposed transducer mount support plate which protrudes forward from the front, Z-axis translatable tool support platform. The rear transducer mount support plate has a generally rectangular shape, and is pivotably mounted near the rear or inner transverse edge wall thereof, by a pair or first, upper rear pivot joints, between a pair of laterally opposed, vertically elongated rectangular buttress walls which protrude forwardly from the Z-axis translatable tool support platform.

The rear transducer mount support plate is provided with a shallow rectangularly-shaped notch which protrudes rearwardly from the front edge wall of the plate and forms at laterally opposed edges thereof a pair of short laterally opposed, parallel rectangular bar-shaped arms which protrude forward from the rear transverse edge wall of the notch. A front transducer mount assembly is pivotably mounted in the notch between the arms, by a pair of second, upper front pivot joints. The latter include a pair of laterally opposed conical bearing pins which protrude laterally inwardly from the end of each of the two arms, the inner ends of the bearing pins being received by a pair of opposed roller bearings fixed in the upper ends of a pair of vertically disposed rear webs of the transducer mount assembly. One of the webs is pivotably coupled near the lower end thereof by a third, front lower pivot joint to the front end of a horizontally disposed lower linkage bar. The rear end of the lower horizontal linkage bar is pivotably coupled to the inner side of a longitudinally aligned one of the two buttress walls which protrude forward from the Z-axis tool support platform and pivotably supports the upper rear portion of the rear transducer mount support plate, by a fourth, lower rear pivot joint which includes a laterally inwardly protruding pivot pin.

With the construction described above, the rear transducer mount support plate, transducer mount assembly, and fore-and-aft oriented lower horizontal linkage bar comprise a four-bar, parallelogram linkage mechanism which enables the transducer mount assembly to move relative to the Z-axis tool support platform only in a vertical direction, i.e., parallel to the front surface of the Z-axis platform. The four-bar linkage mechanism consists of (1) an upper horizontal linkage bar comprising an outer lateral side portion of the rear transducer mount support plate which has a forward protruding arm and which is pivotably supported at the rear end thereof by a buttress wall protruding from the Z-axis platform, (2) a front vertical linkage bar comprising a vertically downwardly disposed rear side web of the transducer mount assembly which is pivotably fastened at the upper end thereof to the inner side of the support plate arm, (3) a lower rearwardly disposed lower horizontal linkage bar which is pivotably fastened at the front end thereof to the lower end of the transducer mount assembly side web, and (4) a rear vertical linkage bar comprising the vertically disposed buttress support wall which pivotably supports near its upper end the rear transducer mount support plate, and which is pivotably supports near its lower end the rear end of the lower horizontal linkage bar.

The automatic bonding machine according to the present invention includes an ultrasonic force-producing transducer which is fastened to the transducer mount assembly, and an ultrasonic bonding tool attached to the transducer which protrudes downwardly from the front lower end portion of the transducer, the latter being located near the front, lower end of the transducer mount assembly. A compression spring disposed between a vertical lever arm laterally offset from and attached to the rear transducer mount support plate, and the Z-axis tool support platform, resiliently biases the transducer mount assembly and ultrasonic bonding tool tip in a vertically downward direction relative to the Z-axis tool support platform. This construction enables the tool tip, transducer and transducer mount assembly, and rear transducer mount support plate to move resiliently upwardly when the tool tip is moved downwards into contact with a bond site to effect a bond, thereby limiting downward force exerted by the tool tip on a bond site to a value adjustable by adjusting the spring constant or spring preload. Preferably, resilient upward displacement of the transducer mount assembly is also used to open a pair of electrical switch contacts, thereby providing a logic signal which initiates application of an electrical current pulse of a pre-determined duration to the ultrasonic transducer.

A preferred embodiment of an automatic ultrasonic bonding machine according to the present invention also includes a wire spool for holding a supply of bonding wire, a drag tube assembly for exerting a rearwardly directed frictional force which resists forward motion of the wire from the spool, a clamp assembly for grasping the upper end of a wire protruding through the bore of the bonding tool to grasp, pull and thereby sever the wire after formation of a bond, a platform pivotably mounted on the upper side of the transducer mount assembly for pivotably supporting the clamp assembly and drag tube relative to the transducer mount assembly and the transducer, a clamp/drag tube pivot support platform actuator, an electronic flame-off torch pivotably mounted to the underside of transducer mount assembly, and an electronic flame-off torch pivot support actuator. The function of the foregoing elements is described below.

An automatic ultrasonic bonding machine according to the present invention also includes a Y-axis motor for driving the Y-axis tool support platform and rollably attached X-axis and Z-axis platforms to position the tip of the ultrasonic bonding tool at precisely determinable Y-coordinates relative to a workpiece. The machine also includes an X-axis motor for driving the X-axis tool support platform and rollably attached Z-axis tool support platform to position the tool tip at precisely pre-determinable X-axis positions relative to a workpiece, and a Z-axis motor for driving the Z-axis tool support platform to position the tool tip at precisely pre-determinable Z-axis locations.

In a typical application of an automatic ultrasonic bonding machine according to the present invention, a pattern recognition television camera, camera monitor and computer are functionally interconnected to provide position command signals to the tool support platform drive motors, and to other actuator mechanisms of the machine. Operation of the machine typically includes the steps of feeding bonding wire from the supply spool down through the drag tube, open clamp jaws, upper entrance opening to the bore through the ultrasonic bonding tool, and outwardly from the lower exit opening of the bonding tool bore. The protruding end of the wire is then brought into contact with a bonding site on a test surface by the tool support platform drive motors in response to command signals issued by the computer. A command is then issued by the computer to energize the ultrasonic transducer with an electrical impulse of a pre-determined duration, thus forming a wedge bond between the wire end and the bond site on the test surface. Command signals are then issued to close the clamp jaws on the length of wire between the bonding tool and drag tube, and to translate the Z-axis tool support platform upwardly sufficiently far to sever the wire end at the bond site. A command signal is then issued to pivot the support platform for the drag tube and clamp assembly vertically downwards a pre-determined distance, thus extending the severed wire end a pre-determined distance below the lower exit opening of the tool tip bore. Next, a command signal is issued to pivot the end of the electronic flame-off torch downwardly and forwardly to a location below the wire end, and a signal issued to initiate an electrical arc discharge of pre-determined energy and duration between the tip of the electronic flame-off torch and the end of the wire, thus causing the end of the wire to melt and resolidify to form thereat a fusion ball of pre-determined characteristics, including size, shape and crystalline structure. The clamp jaws are then released and the drag tube and clamp support platform pivoted upwards to its rest position. During this step, rearwardly directed tension is exerted on the bonding wire by frictional contact between inner wall surface of the drag tube bore and the wire therewithin. This tension pulls the wire taut, thus insuring that the fusion ball is seated on the lower surface of the bonding tool tip. The tool tip is then translated horizontally and downwardly towards a pre-determined bonding site on a workpiece. The bonding tool is then brought into contact with a bonding site, and a pulse of ultrasonic bonding energy of a pre-determined duration is applied to the ultrasonic transducer, that energy being coupled through the tool to its tip and thus forming an ultrasonic bond at the site. The tool tip may be moved to a different location to form a second bond, or additional bonds. After the first bond, or the last bond in a sequence has been made using the same wire, the jaw clamps are closed and the Z-axis tool support platform translated upwardly to sever the wire, thus completing a bonding cycle, which may be repeated at a rate of 5 to 10 bond cycles per second.

In the preferred embodiment, the pattern recognition camera and computer cooperate to provide command signals to the positioning and actuating mechanisms of the machine which enable the machine to repeat the bonding steps described above at high rates on pre-determined locations of workpieces which are identified by pattern recognition software.

BRIEF DESCRIPTION OF THE DRAWINGS

FIG. 8 is a fragmentary upper front perspective view of the apparatus of FIG. 2, showing an ultrasonic transducer and bonding tool thereof.

FIG. 9B is a fragmentary front elevation view of the structure of FIG. 9A.

FIG. 10A is a fragmentary lower plan view of the tool support platform of FIG. 7.

FIG. 10B is a front elevation view of a Y-axis drive motor of the apparatus of FIG. 2.

FIG. 10C is a right side elevation view of the Y-axis drive motor of FIG. 10B.

FIG. 10D is a transverse sectional view of the tool support platform of FIG. 10A, showing a bearing way thereof.

DESCRIPTION OF THE PREFERRED EMBODIMENTS

Figure 1:
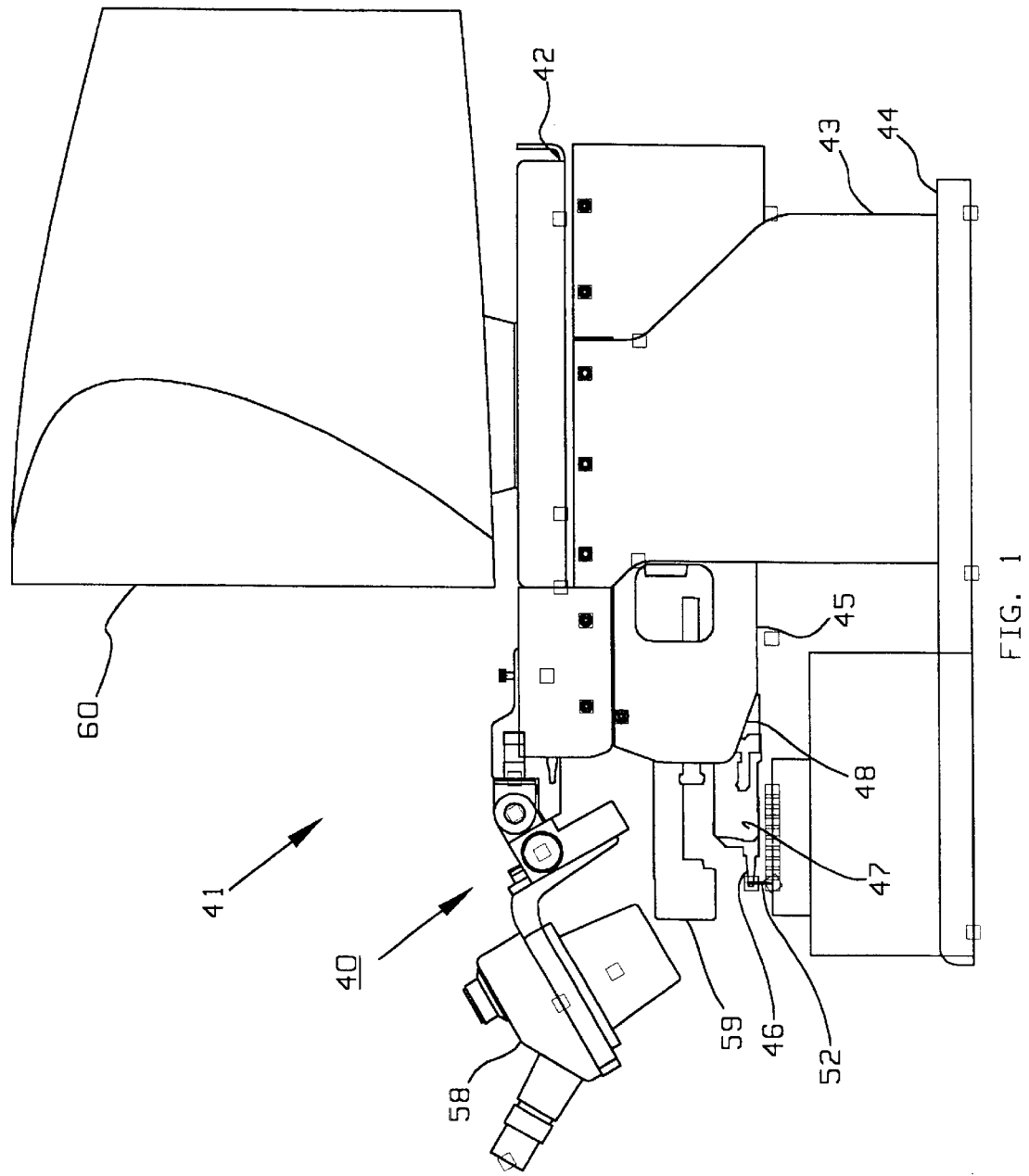
FIG. 1 is a right side elevation view of an automatic ultrasonic wire bonder with cascaded orthogonally translatable tool support platforms according to the present invention.

Referring now to FIGS. 1–30, an automatic ultrasonic bonding machine with vertically tiered orthogonally translatable tool support platforms is shown. The embodiment of the invention shown in FIGS. 1–6 includes an underlying support structure for mounting the machine on a bench. However, as will be clear from the ensuing description and reference particularly to FIGS. 7–27, the novel design and construction of the machine particularly well adapts the machine to be suspended from an overlying support structure and located over a work area of larger lateral extent, e.g., a conveyor Referring now to FIGS. 1–7, an automatic ultrasonic bonding machine 40 according to the present invention may be seen to include a positioning and actuating mechanism indicated generally by the number 41, which comprises a major component of the invention. As shown in FIGS. 1–7, mechanism 41 includes an upper support plate 42 which in the embodiment shown in the figures, is supported by a pair of laterally spaced apart, vertically disposed parallel support walls 43 which depend perpendicularly upwardly from a base plate 44 and which are fastened to the underside of the upper support plate. This arrangement enables bonding machine 40 to be used in bench-top applications.

Figure 26:
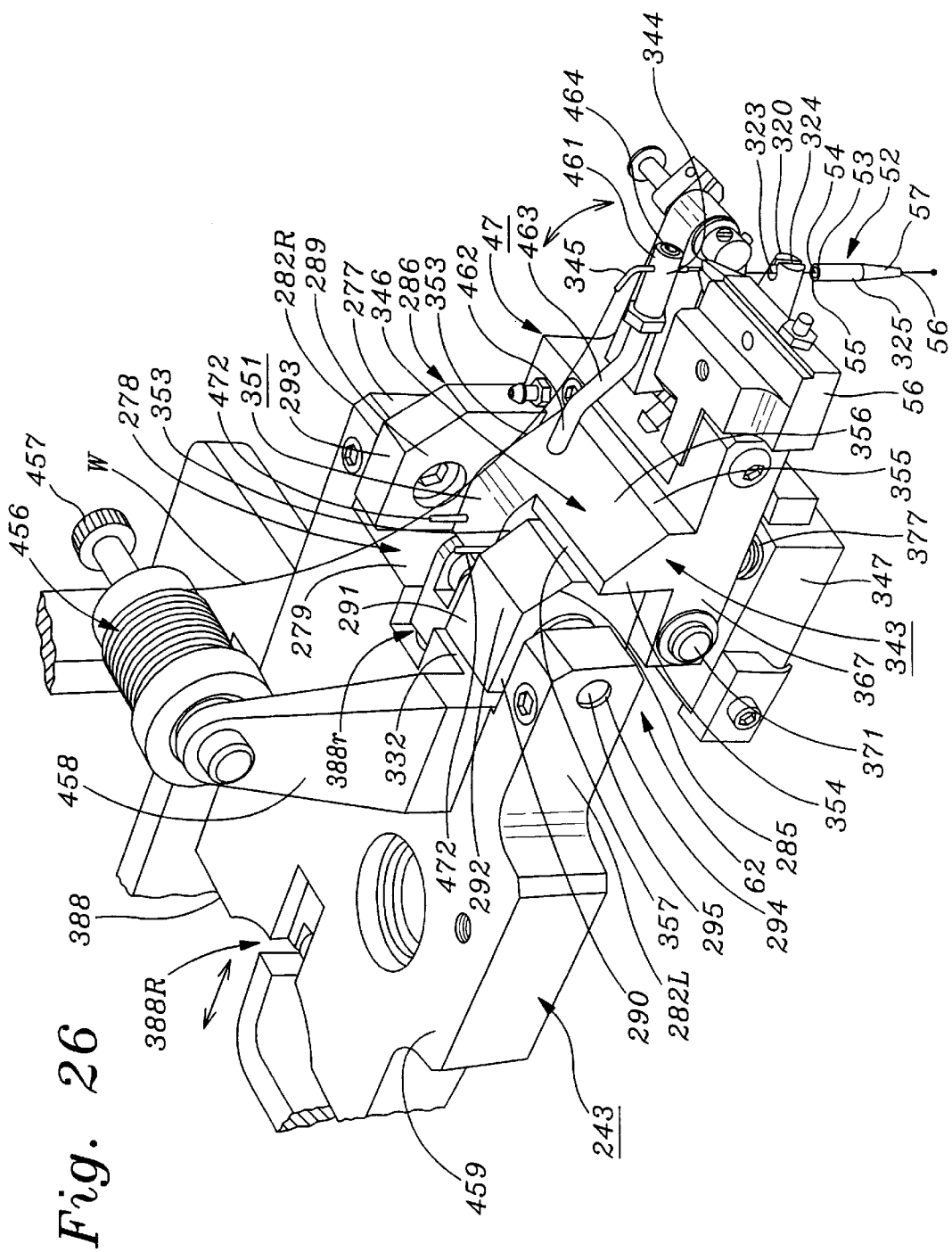
FIG. 26 is a fragmentary upper perspective view of the structure of FIGS. 8 and 9A, on a somewhat enlarged scale.

Referring still to FIGS. 1–7, it may be seen that bonding machine 40 preferably includes a lower fore-and-aft or longitudinally elongated cover plate 45 having a generally U-shaped transverse cross-section, which partially covers a lower portion of mechanism 41. As may be seen best by referring to FIGS. 1, 2, 5 and 6, bonding machine 40 includes an ultrasonic transducer 46 mounted to the underside of an ultrasonic transducer mount assembly 47 which protrudes forward from the front lower portion of mechanism 41, forward of the front edge wall 48 of lower cover plate 45. As shown in the figures, particularly FIG. 23, ultrasonic transducer 46 has a longitudinally elongated, generally cylindrically-shaped body having a radially inwardly and forwardly tapered front portion 49. Near the front end face 50 of front portion 49 of transducer 46, a bore 51 is disposed vertically through the transducer, and receives therethrough a vertically disposed ultrasonic bonding tool 52. As shown in FIG. 26, ultrasonic bonding tool 52 has a generally tubular shape, having through its length a small diameter bore or capillary 53 for slidably receiving lengths of fine bonding wire. Capillary 53 has an upper bonding-wire entrance opening 54 in upper transverse end face 55 thereof, and a lower bonding-wire exit opening 56 in the lower end face 57 thereof, the lower end face serving as the tool surface for ultrasonically vibrating a bonding wire against workpiece surfaces to ultrasonically weld the end of the wire to the workpiece surfaces.

Referring still to FIGS. 1–6, it may be seen that automatic ultrasonic bonding machine 40 preferably includes a stereoscopic microscope 58 which enables a human operator to view a workpiece, a television camera 59 for forming an electronic image of a workpiece area viewed by the camera, and a monitor 60 connected to the camera for displaying a visual image of the camera field of view to an operator. Ultrasonic bonding machine 40 also includes a computer (not shown) which contains pattern recognition software effective in processing electronic images of a workpiece formed by camera 59 and issuing command signals to positioning and actuating components of the machine which cause the bonding tool to make ultrasonic bonds at predetermined locations of a workpiece referenced to initial sightings of reference features of a workpiece viewed by an operator on monitor 60. Monitor 60 is also preferably operably interconnected with the computer (not shown) to provide a graphic user interface with the computer which facilitates operation of the machine. The use of a computer and pattern recognition software to position a machine component at a pre-determined position relative to a workpiece is a well known expedient employed in many automatic manufacturing operations, is well understood by those skilled in the art, and therefore will not be described in detail in this specification.

Figure 2:
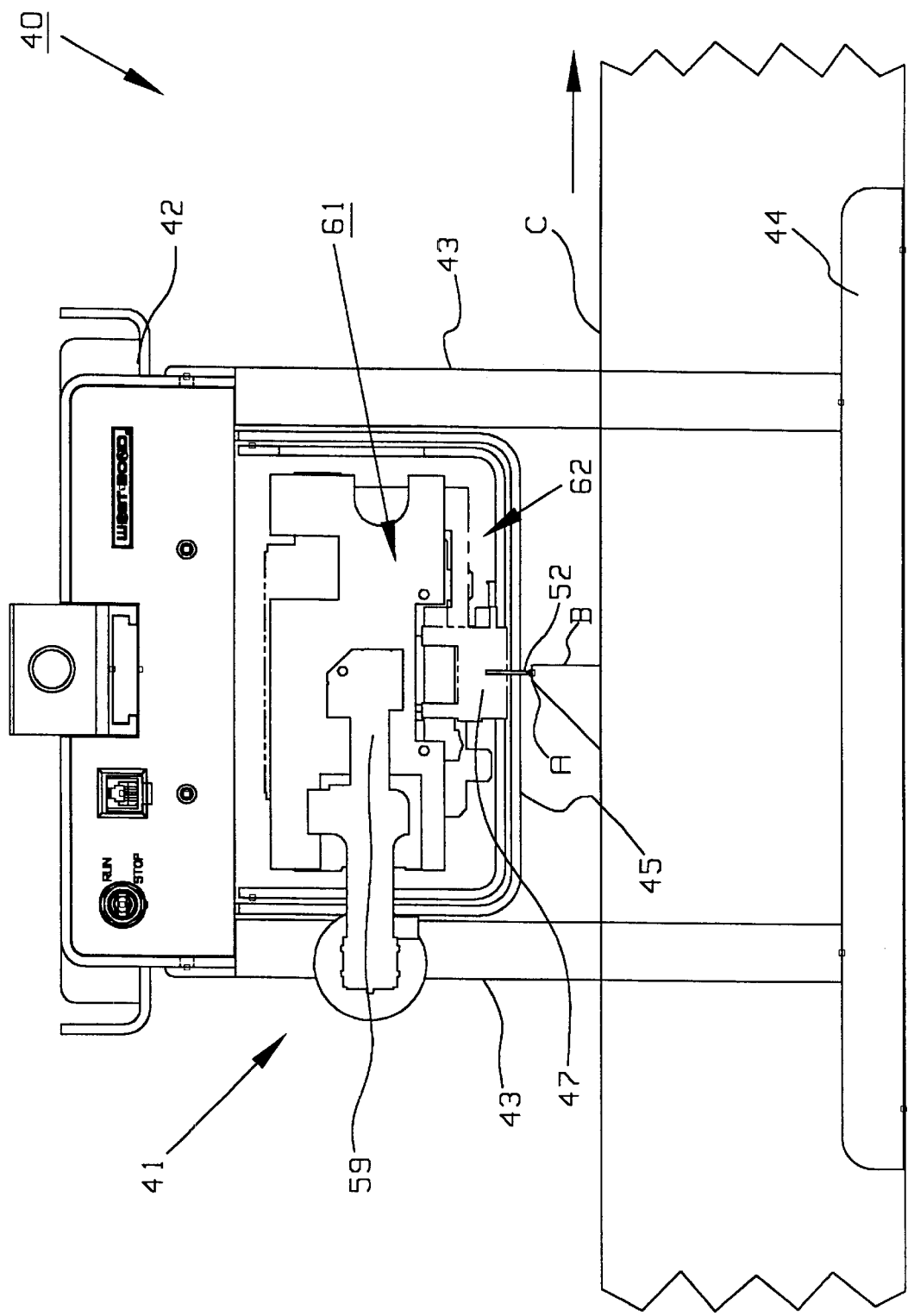
FIG. 2 is a fragmentary front elevation view of the apparatus of FIG. 1, showing a monitor thereof removed.
Figure 3:
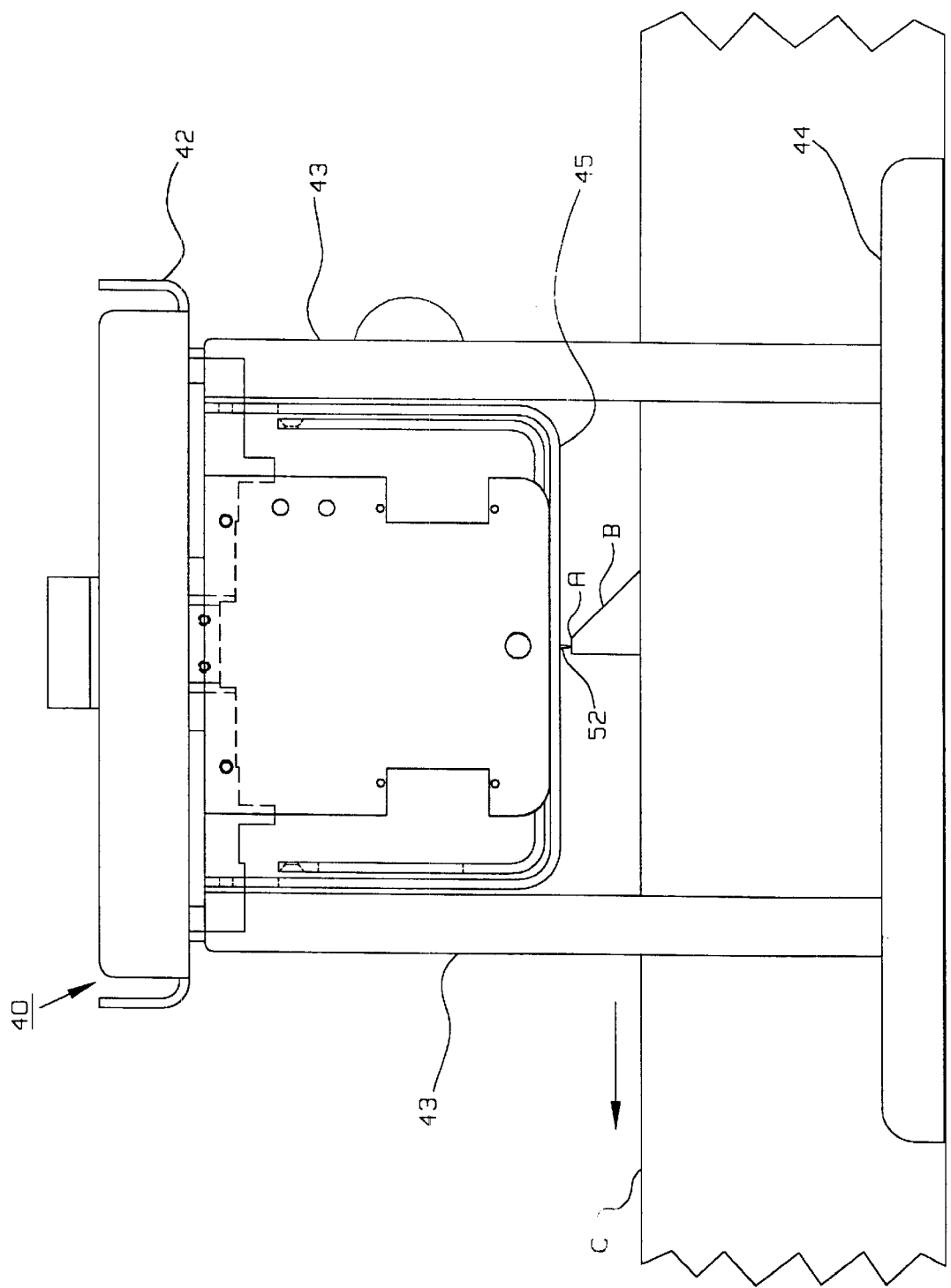
FIG. 3 is a rear elevation view of the apparatus of FIG. 2.
Figure 4:
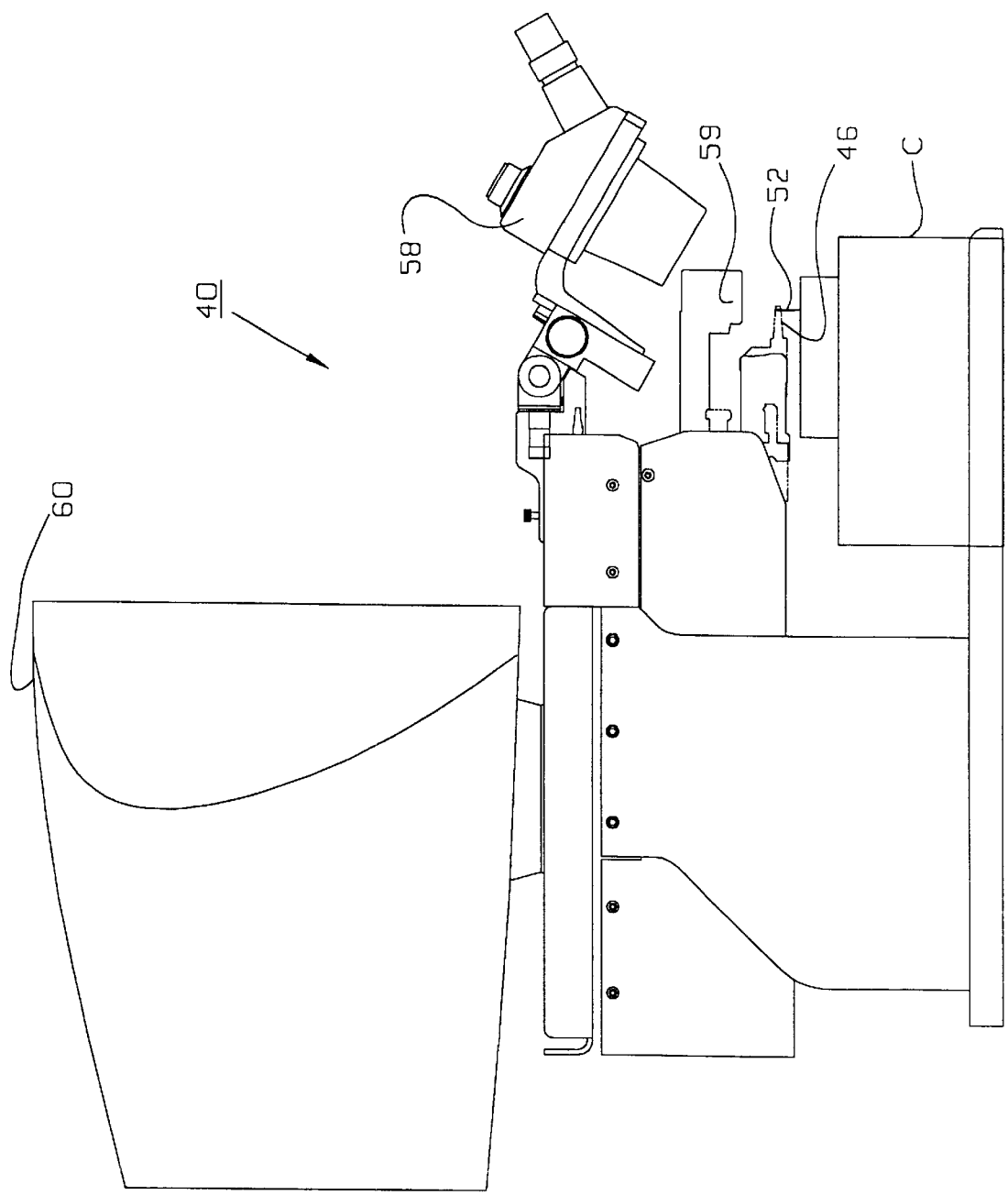
FIG. 4 is a left side elevation view of the apparatus of FIG. 1.
Figure 5:
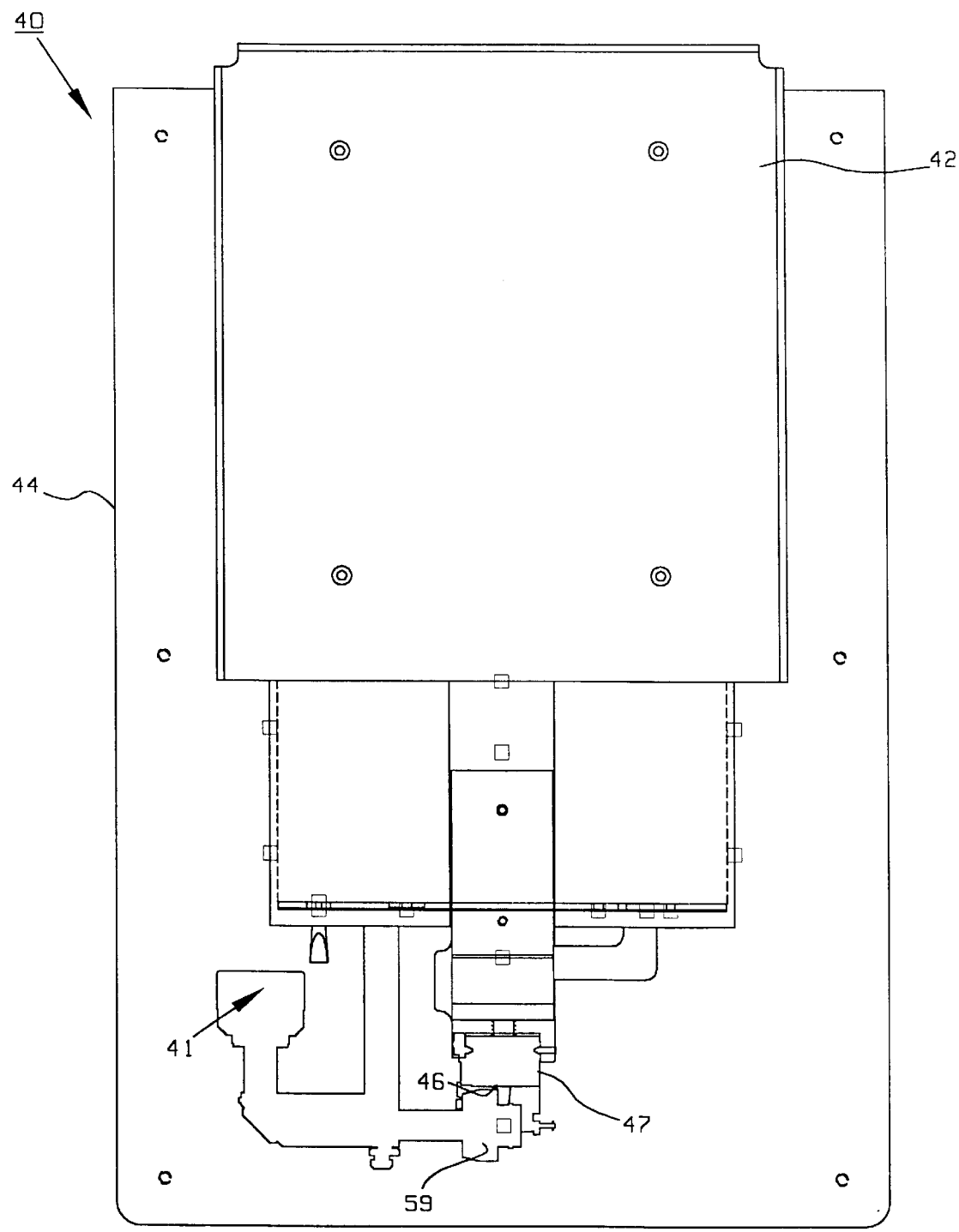
FIG. 5 is an upper plan view of the apparatus of FIG. 2.
Figure 6:
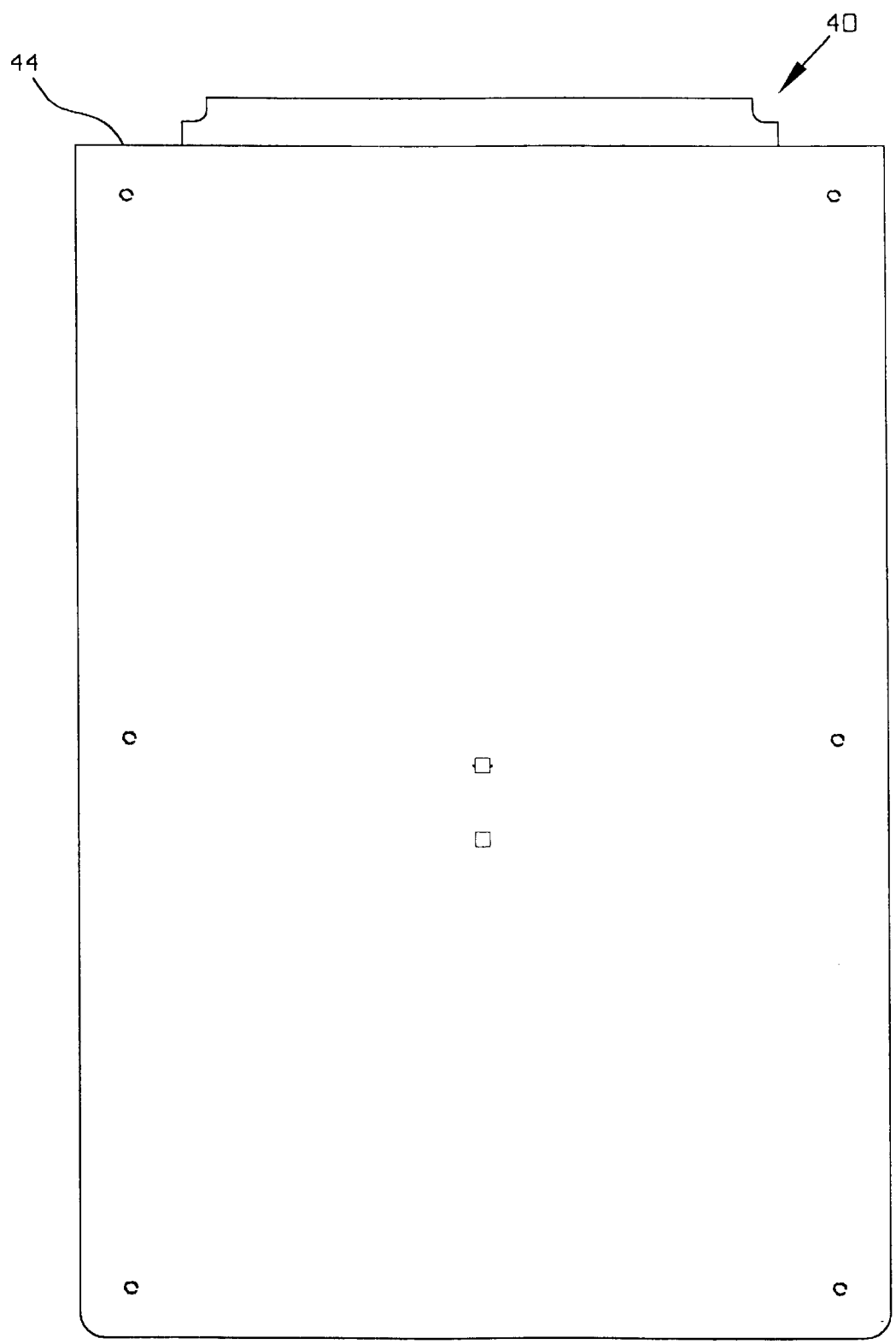
FIG. 6 is a lower plan view of the apparatus of FIG. 2.

Referring now to FIGS. 2–7, it may be seen that positioning and actuating mechanism 41 of automatic bonding machine 40 includes a positioning mechanism indicated generally by the number 61, which is suspended from an upper, main support plate 42. A primary function of positioning mechanism 61 is to move tip 57 of ultrasonic bonding tool 52 in three dimensional coordinate space to pre-determined contact points or bond sites of a workpiece where ultrasonic bonds are to be formed by the machine. An example application of machine 40 is shown in FIG. 2, in which tool 52 is used to make bonds on a workpiece A supported by a pedestal B on a conveyor C. Positioning and actuating mechanism 41 of machine 40 also includes individual actuator mechanisms indicated generally by the number 62 which are attached to ultrasonic transducer mount assembly 47, and which are described in detail below following a description of positioning mechanism 61.

Figure 7:
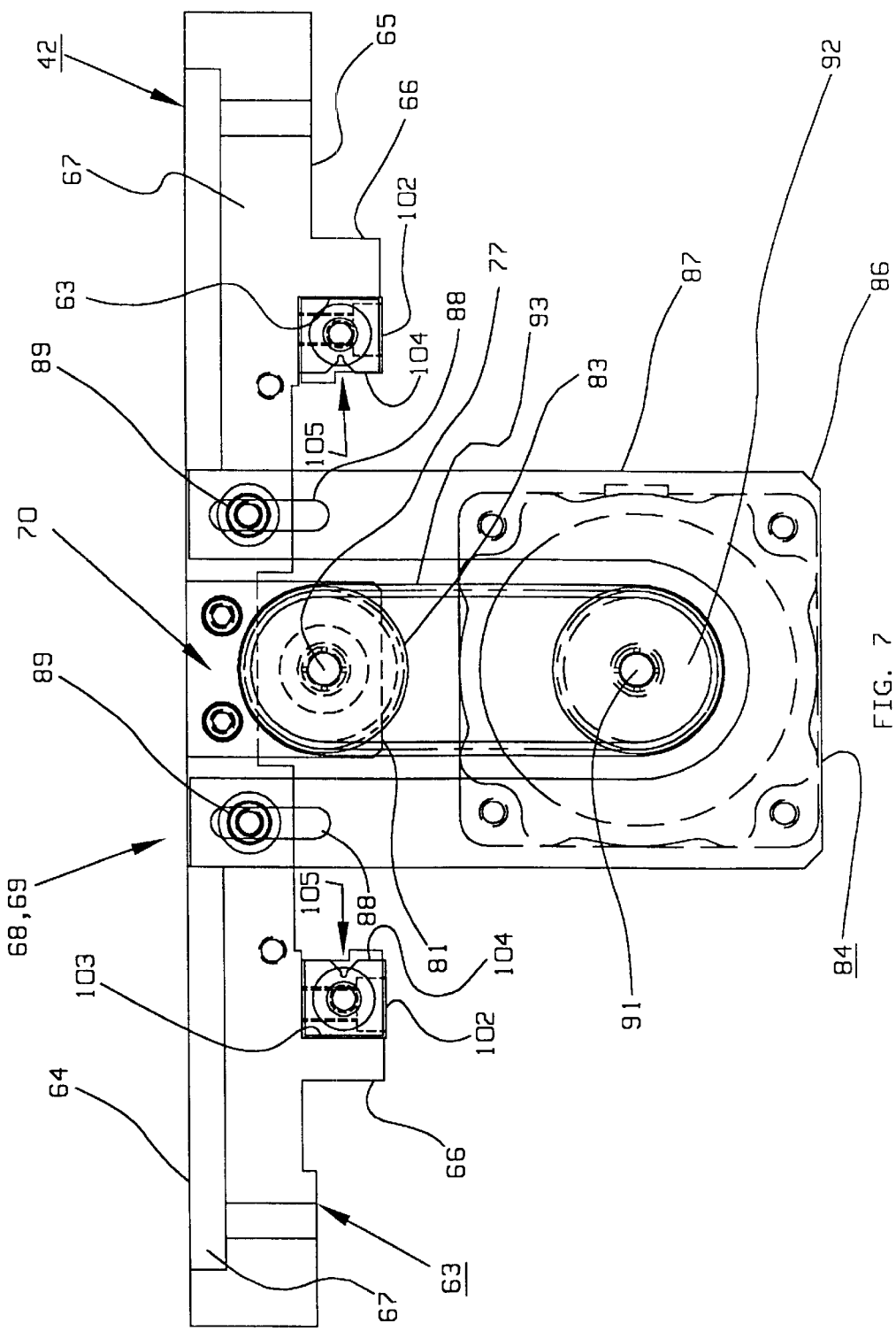
FIG. 7 is a fragmentary rear elevation view of the apparatus of FIG. 2, showing an upper, main mounting support plate for a first, Y-axis tool support platform and drive components of a Y-axis positioning mechanism comprising part of the apparatus.
Figure 11:
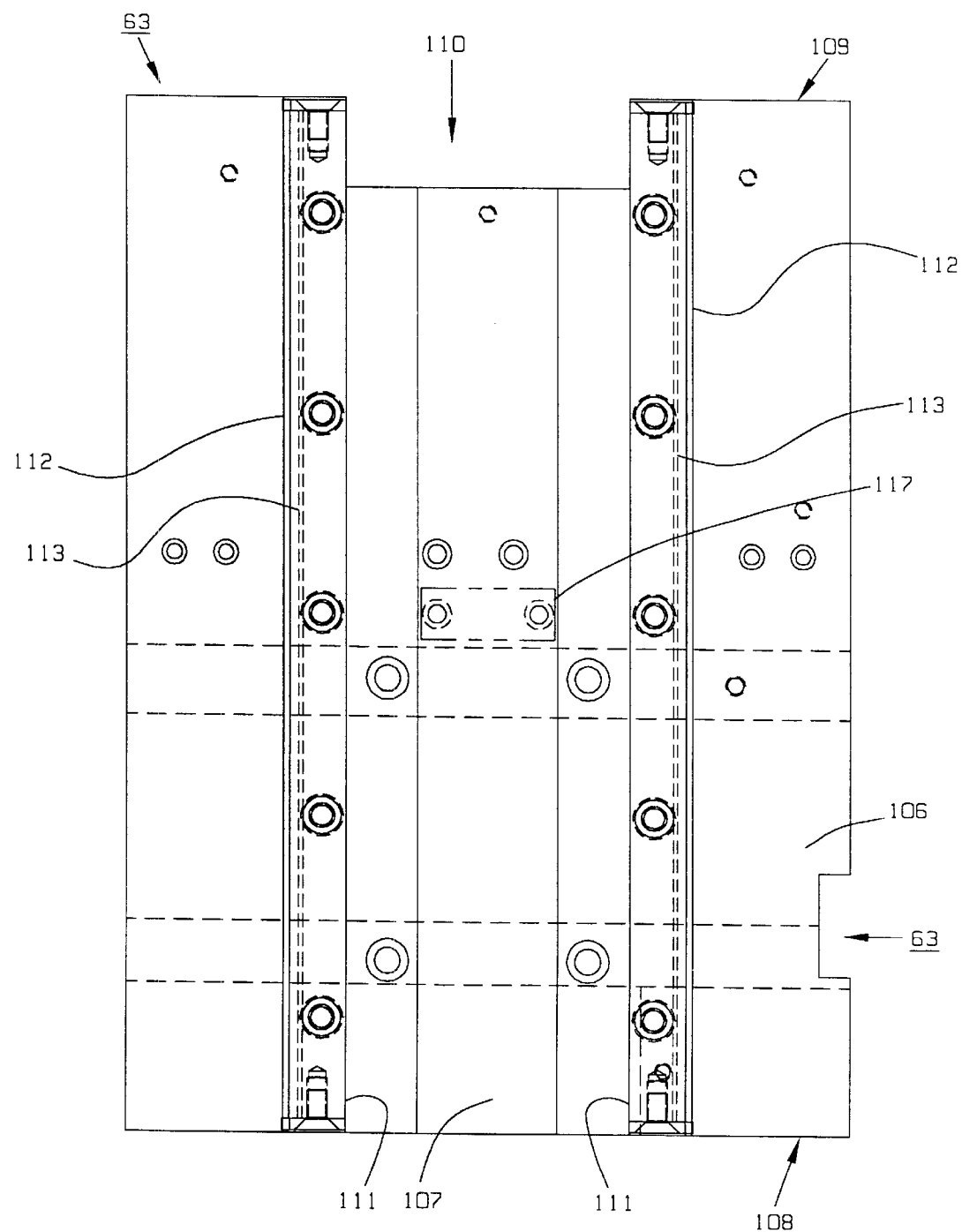
FIG. 11 is an upper plan view of the Y-axis fool support platform of FIG. 7.

Referring now to FIGS. 7, 10 and 11, it may be seen that positioning mechanism 61 of automatic bonding machine 40 includes a first, upper Y-axis tool support platform 63 which is rollably translatably mounted to the underside of upper mechanism support plate 42. As may be seen best by referring to FIG. 7, upper mechanism support plate 42 has the shape of a longitudinally elongated rectangular plate having a generally flat upper surface 64. As shown in FIGS. 7 and 10A, the lower surface 65 of upper tool support plate 42 has protruding downwardly therefrom a pair of laterally spaced apart, longitudinally disposed rectangular cross-section ribs 66. Ribs 66 preferably traverse the entire length of upper support plate 42. Rear transverse face wall 67 of upper support plate 42 has formed therein a laterally symmetrically-shaped and located notch 68 having a laterally elongated, rectangularly-shaped rear, outer portion 69 and a laterally elongated, rectangularly-shaped front, inner stepped portion 70 of smaller width than the outer portion. As shown in FIG. 10A, upper support plate 42 includes a rear generally rectangularly-shaped bearing support block 71 which protrudes perpendicularly downwards from lower surface 65 of the upper support plate, and which is disposed laterally between longitudinal ribs 66.

Referring now to FIGS. 7, 10A and 10B, upper support plate 42 of machine 40 may be seen to include means for rollably translatably supporting first, Y-axis tool support platform 63 of FIG. 11 from the underside of the upper support plate, which means are described in detail below. As shown in FIG. 10A, upper support plate 42 includes a Y-axis drive mechanism 72, components of which include an elongated lead screw 73 which is disposed longitudinally below lower surface 65 of the upper support plate. Lead screw 73 has a shaft 74 which is provided with external helical threads 75 which extend over a substantially long central longitudinal portion of the shaft, and front and rear smooth shaft portions 76 and 77. Front portion 76 of lead screw shaft 73 is freely rotatably supported by a front ball bearing assembly 78 fitted within a front bearing support block 79 which protrudes perpendicularly downwards from lower surface 65 of upper support plate 42, near front face wall 80 of the upper support plate. Similarly, rear portion 77 of lead screw shaft 73 is freely rotatably supported by a rear ball bearing assembly 81 fitted within a rear bearing support block 82 which protrudes perpendicularly downwards from rear bearing support block 71.

As may be seen best by referring to FIGS. 7 and 10A, rear portion 77 of lead screw shaft 73 protrudes longitudinally rearward from rear bearing support block 71 to underlie notch 68, and has attached thereto a toothed, flanged pulley 83. As may be seen best by referring to FIGS. 10B and 10C in addition to FIGS. 7 and 10A, Y-axis drive mechanism 72 includes a stepper type electrical drive motor 84 which is mounted to the front surface 85 of a rear U-shaped motor support plate 86. Each upper end of the two upstanding arms 87 of motor support plate 86 has through its thickness dimension a vertically elongated aperture 88 which receives a bolt 89 that secures the plate to rear, inner face 90 of rear portion 69 of notch 68.

As shown in FIG. 7, Y-axis drive motor 84 has an output shaft 91 that has attached to a rearwardly projecting portion thereof a toothed, flanged drive pulley 92. Y-axis drive mechanism 72 includes a toothed, flexible endless drive belt 93 which is looped around and engages motor drive shaft pulley 92 and lead screw pulley 83.

As may be seen best by referring to FIGS. 10B and 10C, Y-axis drive motor 84 is preferably provided with a shaft angle position indicator or encoder 94. The latter comprises an interrupter wheel 95 which is attached to a forward protruding end of motor shaft 91, the wheel being provided with a plurality of regularly circumferentially spaced apart sector slots 96 cut radially inwardly from the outer peripheral edge wall 97 of wheel 95. Shaft angle encoder 94 includes a photo interrupter detector assembly 98 comprised of a light source such as light emitting diode 99 positioned on one side of wheel 95 near peripheral edge 97 thereof, and a photo detector 100 such as a photodiode or photo transistor located on the opposite side of the wheel and axially aligned with the light source.

Referring now to FIGS. 7 and 10A, structure for rollably supporting Y-axis tool support platform 63 from upper support plate 42 may be seen to include a pair of laterally spaced apart longitudinally disposed, square cross-section linear bearing ways 102 mounted flush with lower surface 65 of upper support plate 42 and abutting inner vertical side walls 103 of ribs 66. As may be seen best by referring to FIG. 10D, the inner facing longitudinally disposed vertical walls 104 of each of the two bearing ways 102 has formed therein a longitudinally disposed, generally V-shaped bearing groove 105, the sides of which are perpendicular to one another.

Referring now to FIG. 11, it may be seen that Y-axis tool support platform 63 has the shape of a plate with a longitudinally elongated, rectangular plan view cross-section. Y-axis tool support platform 63 has formed in the upper surface 106 thereof a longitudinally elongated, rectangular cross-section channel 107 which penetrates front and rear transverse face walls 108 and 109 of the platform. Rear transverse face wall 109 of Y-axis tool support platform 63 formed therein a laterally elongated rectangularly shaped notch 110.

Referring still to FIG. 11, it may be seen that Y-axis tool support platform 63 includes a pair of laterally spaced apart, longitudinally disposed square cross-section linear bearing ways 111 mounted to upper surface 106 of the Y-axis tool support platform. The two outer longitudinally disposed vertical walls 112 of bearing ways 111 each has formed therein a longitudinally disposed, generally V-shaped bearing groove 113, the sides of which are also perpendicular to one another.

As may be seen best by referring to FIG. 13, Y-axis tool support platform 63 is located below upper support platform 42 with bearing ways 111 on the upper surface of the Y-axis tool support platform positioned laterally between bearing ways 102 on the lower surface of the upper support platform. The lateral spacing between outer vertical wall surfaces 112 of Y-axis tool support platform bearing way pair 111 protruding upwardly from Y-axis tool support platform 63 is slightly less than the lateral spacing between the inner vertical wall surfaces 104 of the two bearing ways 102 which protrude downwardly from upper support platform 42. Thus positioned, a V-shaped groove 105 in the inner facing vertical wall 104 of each outer bearing way 102 protruding downwardly from upper support platform 42 is laterally aligned with an adjacent V-shaped groove 113 in the outer vertical wall 1 12 of a Y-axis tool support platform bearing way 111, forming therewith a longitudinally disposed, generally rectangularly shaped composite bearing way groove 105–113.

Figure 13:
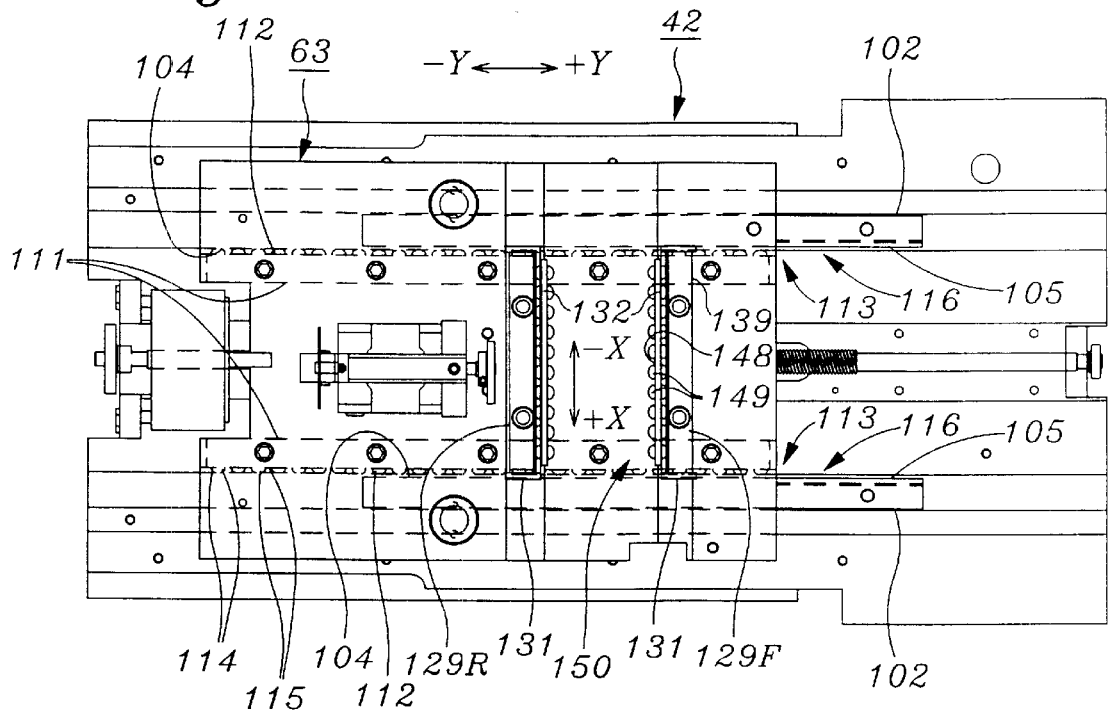
FIG. 13 is a lower plan view of the Y-axis tool support platform of FIG. 12, showing the platform mounted to the underside of the main upper support plate.

As shown in FIG. 13, each of the two Y-axis composite bearing way grooves 105–113 holds therein a longitudinally elongated roller bearing cage 114. Each roller bearing cage 114 rollably holds a row of longitudinally spaced apart, cylindrical roller bearings 115. Roller bearings 115 are right circular cylinders each having a diameter equal to its height. The axes of odd-number cylindrical roller bearings 115 are parallel to a first face of a V-shaped bearing way groove such as groove 105 of upper support plate bearing way 102, while the axes of even-number cylindrical roller bearings are parallel to the second face of a bearing way groove. The combination of each upper support plate bearing way 102, Y-axis tool support platform bearing way 111, cylindrical roller bearing cage 114 and cylindrical roller bearings 115 comprises a separate one of a pair of Y-axis tool support platform bearing assemblies 116. The latter enable translation of Y-axis tool support platform 63 in a longitudinal or Y-axis direction with respect to upper support platform 42, with a minimum of static and rolling friction, and a minimum degree of lateral and vertical run-out.

Components of Y-axis drive mechanism 72 used to convert rotary motion of Y-axis drive motor 84 to linear motion of Y-axis tool support platform 63 are shown in FIGS. 10A and 11. As shown in those figures, drive mechanism 72 includes a generally square cross-section drive block 117 which protrudes perpendicularly upwardly from the base wall 118 of channel 107 in upper wall 106 of Y-axis tool support platform 63. Drive block 117 has through its thickness dimension a longitudinally disposed threaded bore 119 which threadinigly receives threaded portion 75 of lead screw shaft 74. Thus, when Y-axis drive motor 94 rotates lead screw 74 in a first rotation direction about its longitudinal axis, drive block 117 and attached Y-axis tool support platform 63 are extended longitudinally relative to upper platform 42, and retracted when the drive motor rotation direction is reversed.

As shown in FIGS. 14–16 and 20, positioning mechanism 41 of automatic bonding machine 40 includes an X-axis tool support platform 121, positioned beneath Y-axis tool support platform 63, which is rollably translatable laterally with respect to the Y-axis tool support platform, and a Z-axis tool support platform 122 which is mounted on a front portion of the X-axis tool support platform and rollably translatable in a vertical direction with respect to the X-axis tool support platform.

Figures 12A, 12B:
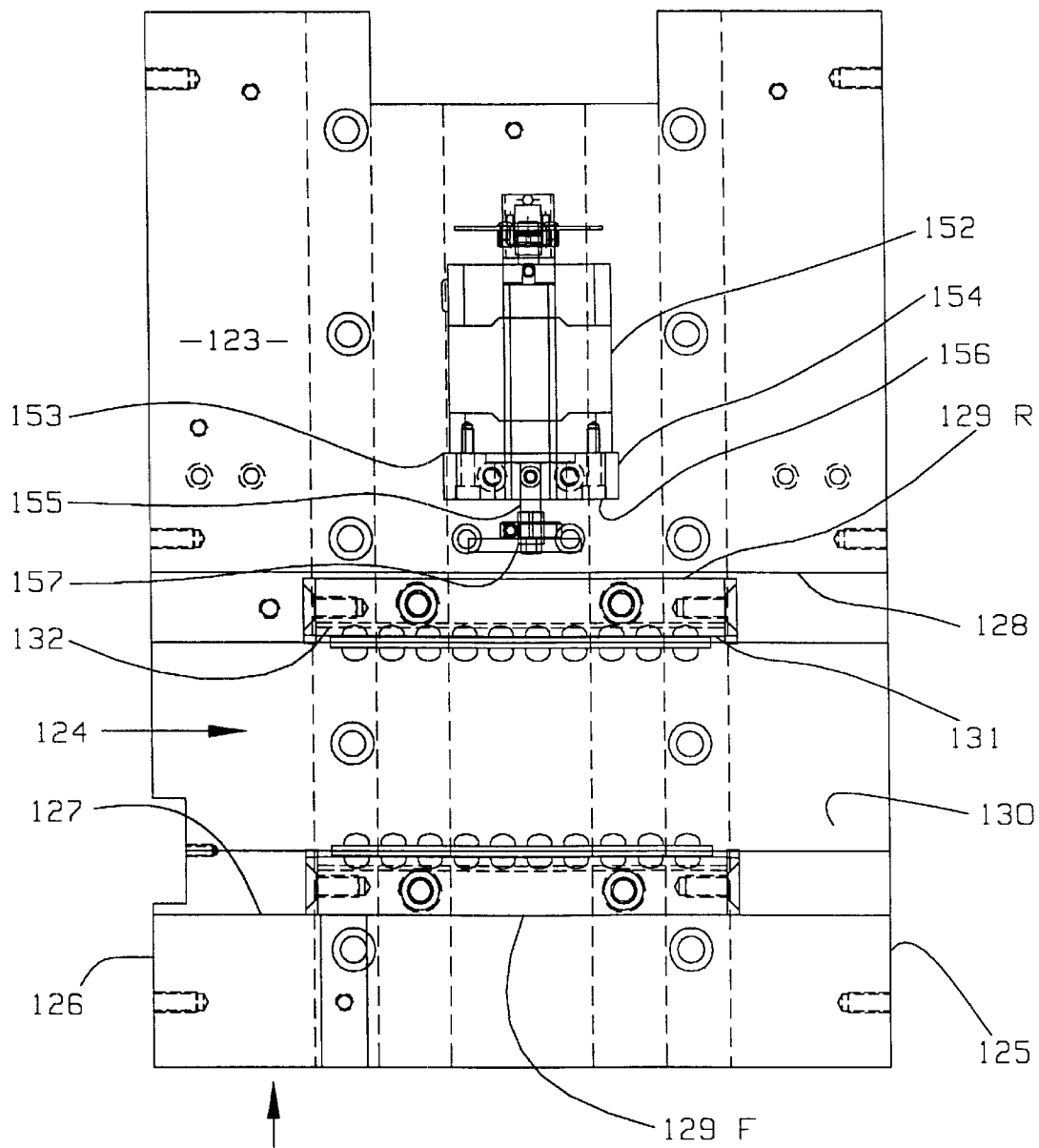
FIG. 12A is a lower plan view of the Y-axis tool support platform of FIG. 11.
FIG. 12B is a front elevation view of an X-axis drive motor mounted on the Y-axis platform of FIG. 12A.

FIGS. 12 and 13 illustrate components of positioning mechanism 40 which are used for rollably mounting X-axis tool support platform 121 on the underside of Y-axis tool support platform 63, and for translating the X-axis tool support platform relative to the Y-axis platform. Thus, as shown in FIG. 12A, Y-axis tool support platform 63 has formed in the lower surface 123 thereof a shallow relatively wide laterally elongated notch 124 which is disposed transversely across the width of the Y-axis tool support platform, penetrating left and right side faces 125 and 126 of the Y-axis tool support platform. Notch 124 is located in a front longitudinal portion of Y-axis tool support platform 63, and has front and rear parallel, transversely disposed edge walls 127 and 128, respectively.

As shown in FIGS. 12 and 13, a pair of longitudinally spaced apart, laterally disposed square cross-section front and rear bearing ways 129F, 129R, are fastened to lower wall face 130 of notch 124, the outer vertical edge walls of the bearing ways abutting front and rear side walls 127 and 128, respectively, of the notch. As may be seen best by referring to FIG. 12A, the inner facing laterally disposed edge walls 131 of each of the two bearing ways 129 has formed therein a laterally disposed, generally V-shaped bearing groove 132.

Figure 14:
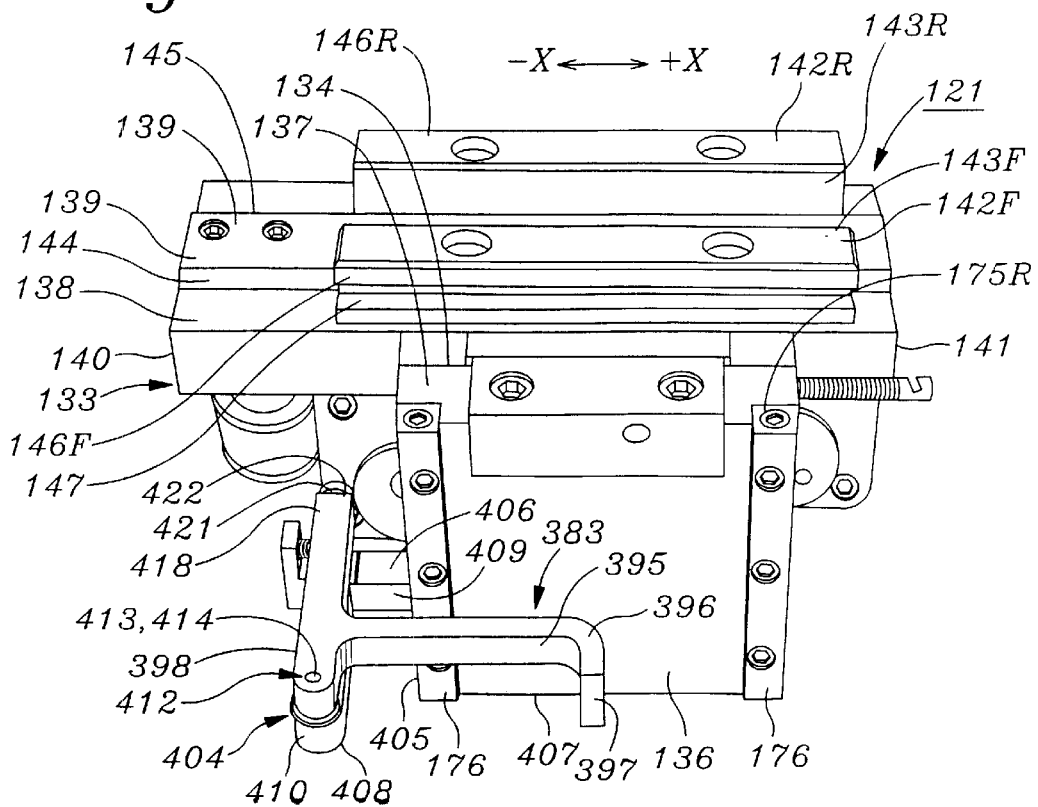
FIG. 14 is an upper front perspective view of a second, X-axis tool support platform of the apparatus of FIG. 2.
Figure 15:
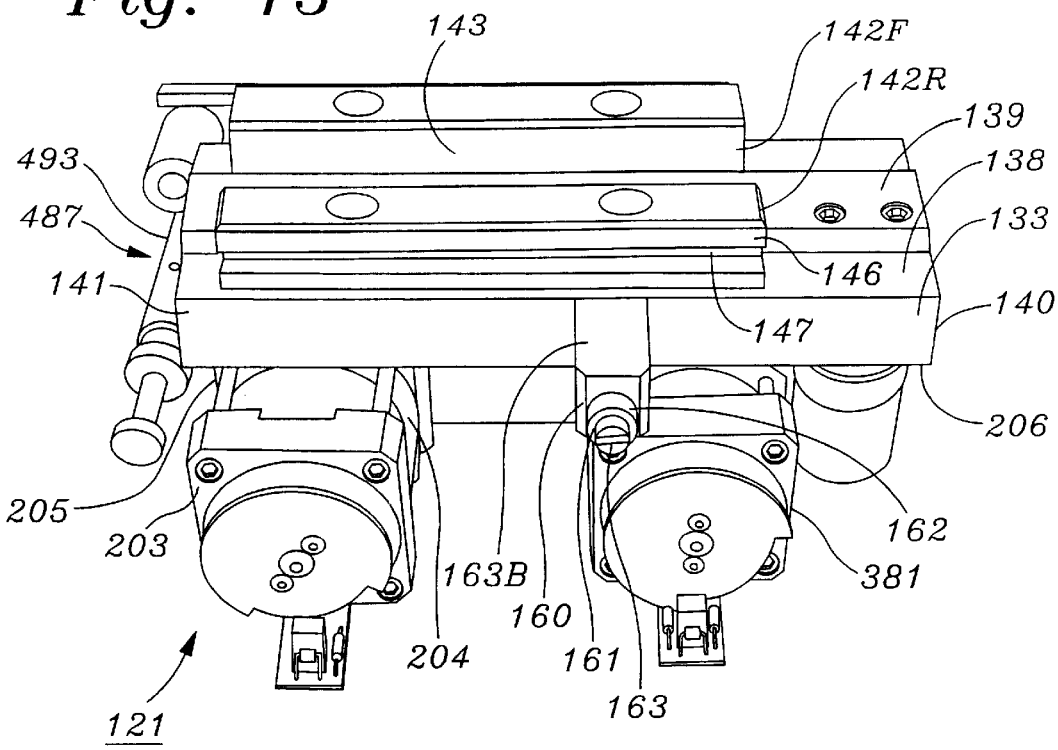
FIG. 15 is an upper rear perspective view of the X-axis tool support platform of FIG. 14.
Figure 16:
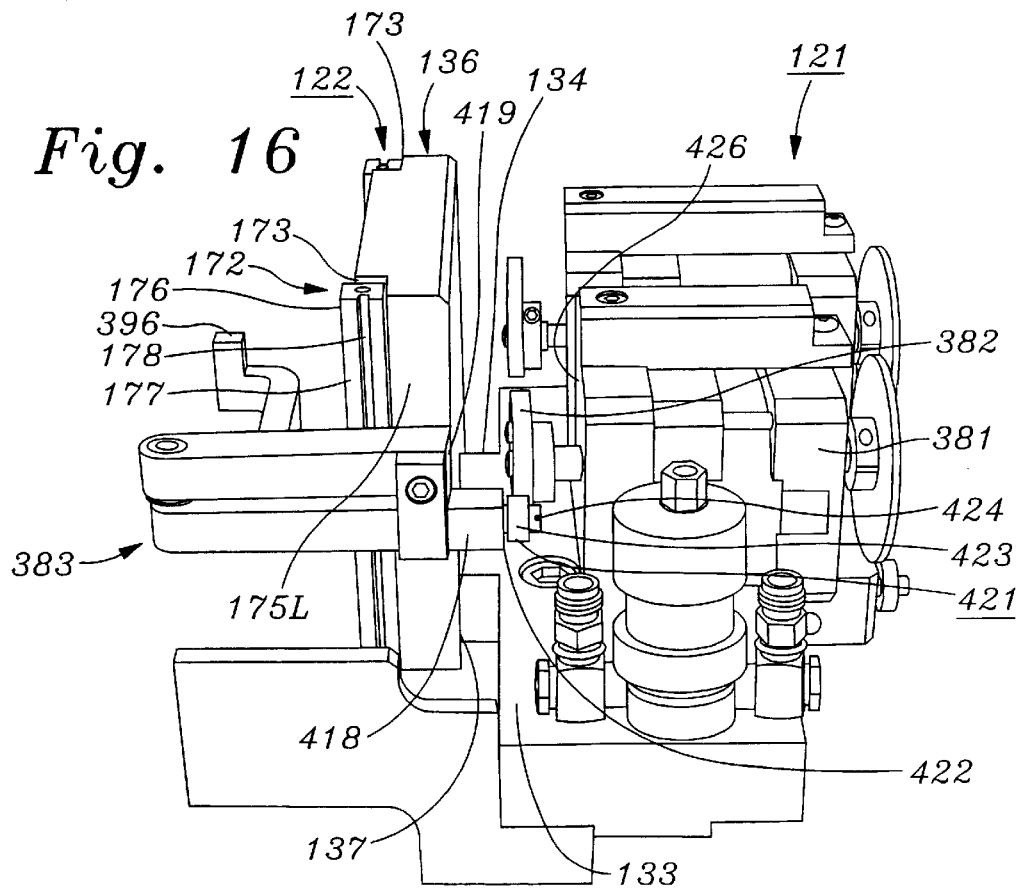
FIG. 16 is a lower left side perspective view of the X-axis tool support platform of FIG. 15.

Referring now to FIGS. 14, 15 and 16, it may be seen that X-axis tool support platform 121 includes a rear generally laterally disposed and elongated, rectangularly-shaped upper plate section 133. X-axis platform 121 also includes a laterally elongated rectangularly-shaped boss section 134 which protrudes forward from front vertical edge wall 135 of rear upper plate section 133. X-axis platform 121 also includes a vertically disposed, generally square front plate section 136 which protrudes perpendicularly downwards from front edge wall 137 of boss 134.

As shown in FIGS. 14 and 15, rear upper plate section 133 of X-axis tool support platform 121 has a generally flat upper surface 138 from which protrudes perpendicularly upwardly a longitudinally centrally located, rectangular cross-section rib 139 which is disposed laterally across the width of the rear plate section, extending from left side wall 140 to right side wall 141 of the rear upper plate section.

Referring still to FIGS. 14 and 15, it may be seen that X-axis tool support platform 121 includes a pair of longitudinally spaced apart, laterally disposed, square cross-section, linear front and rear bearing ways 142F, 142R mounted to upper surface 138 of the X-axis tool support platform. Bearing ways 142 have flat, vertically disposed inner facing side walls 143 which abut front and rear edge walls 144 and 145, respectively, of rib 139 on upper rear plate 133 of X-axis tool support platform 121. The two outer facing front and rear vertically disposed edge walls 146 of bearing ways 142 each has formed therein a laterally disposed, generally V-shaped bearing groove 147.

Figure 30:
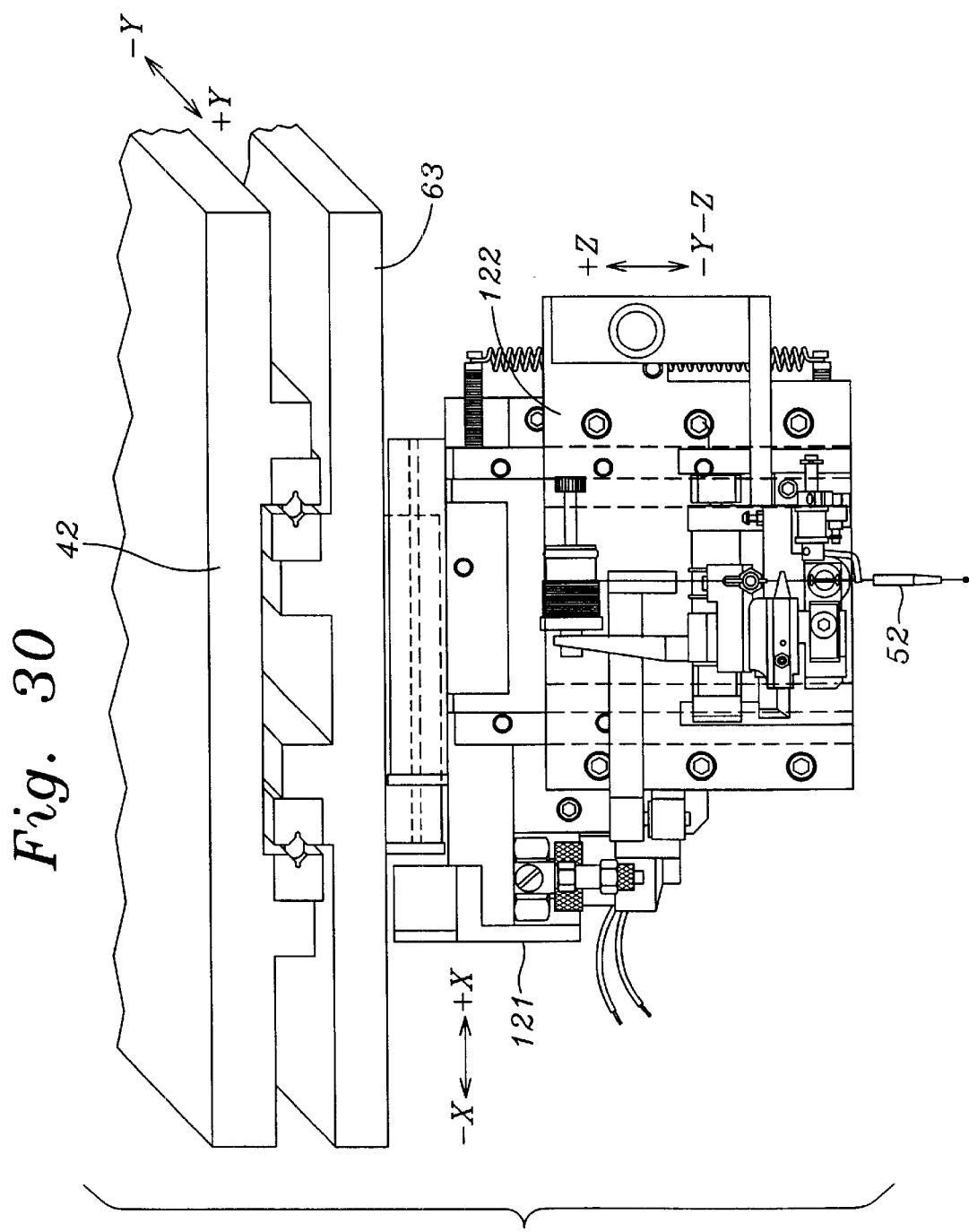
FIG. 30 is a fragmentary front elevation view of the apparatus of FIG. 2.

As may be best visualized by referring to FIGS. 13, 14, and 30, X-axis tool support platform 121 is located below Y-axis tool support platform 63 with bearing ways 142 protruding upwardly from the X-axis tool support platform positioned longitudinally between bearing ways 129 protruding downwardly from the lower surface of the Y-axis tool support platform. The longitudinal spacing between outer vertical wall surfaces 146 of the pair of X-axis tool support platform bearing ways 142 is slightly less than the longitudinal spacing between inner vertical wall surfaces 131 of the two bearing ways 129 which protrude downwardly from Y-axis tool support platform 63. Thus positioned, V-shaped groove 132 in the inner facing vertical wall 131 of each outer bearing way 129 protruding downwardly from Y-axis tool support platform 63 is longitudinally aligned with an adjacent V-shaped groove 147 in the outer vertical wall 146 of an inner bearing way protruding upwardly from X-axis tool support platform 121, forming therewith a laterally disposed, generally rectangularly-shaped composite bearing way groove 132, 147.

As shown in FIG. 13, each of the two X-axis composite bearing way grooves 132, 147 holds therein a longitudinally elongated roller bearing cage 148. Each roller bearing cage 148 holds a row of longitudinally spaced apart, cylindrical roller bearings 149. The combination of each Y-axis tool support platform bearing way 132, X-axis tool support platform bearing way 147, cylindrical roller bearing cage 148 and cylindrical roller bearings 149 comprises a separate one of a pair of X-axis tool support platform bearing assemblies 149. The latter enable translation of X-axis tool support platform 121 in a lateral or X-axis direction with respect to Y-axis tool support platform 63, with a minimum of static and rolling friction, and a minimum degree of longitudinal and vertical run-out.

Components of X-axis drive mechanism 120 used to drive X-axis tool support platform 121 in a lateral or X-axis direction with respect to Y-axis tool support platform 63 are shown in FIGS. 12, 13, 15, and 20.

As shown in FIG. 12, X-axis tool support platform drive mechanism 120 includes an X-axis stepper motor 152 which has a front housing end plate 153 bolted to a support plate 154 which protrudes perpendicularly downwardly from lower surface 123 of Y-axis tool support platform 63. As may be seen best by referring to FIGS. 12 and 13, motor support plate 154 is laterally centrally located with respect to the longitudinal side walls of Y-axis tool support platform 63, and is positioned behind the rear edge wall of notch 124 formed in lower surface 123 of the Y-axis tool support platform. Output shaft 155 of X-axis stepper motor 152 is disposed longitudinally and parallel to lower surface 123 of Y-axis tool support platform 63, and protrudes forward of front face wall 156 of motor support plate 154. The protruding end of motor output shaft 155 has pinned thereto a cam wheel 157 of uniform thickness. As shown in FIG. 12B, cam wheel 157 has over a substantial portion of its angular extent, e.g., 270 degrees, a spiral peripheral surface 158, the radius of which is a linear function of the polar angle of the wheel. Angular rotation of stepper motor 151 is limited by software in both clockwise and counterclockwise directions to a total rotation of less than 270 degrees; accordingly, the unused portion of the peripheral surface of the cam wheel is truncated by a flat 159.

Figure 20:
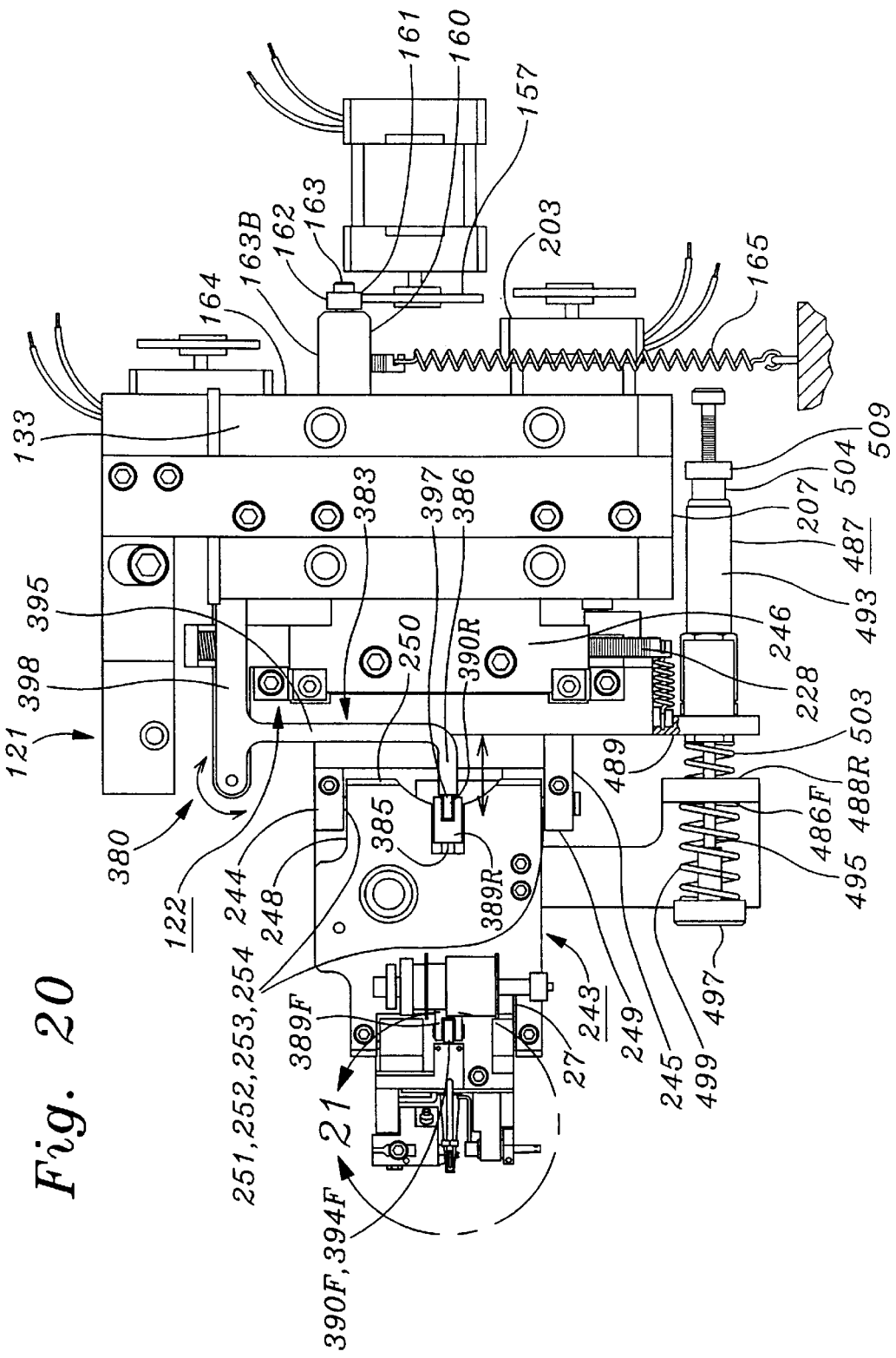
FIG. 20 is a fragmentary upper plan view of the apparatus of FIG. 2, showing the X-axis and Z-axis tool support platforms thereof.

As may be seen best by referring to FIGS. 15 and 20, X-axis drive mechanism 120 includes an X-axis cam follower 160. The latter includes a ball bearing assembly 161 which has a smooth outer cylindrical shell surface 162. Ball bearing assembly 161 is mounted on a longitudinally disposed axle 163 which protrudes rearwardly from a rectangular block=-shaped boss 163B. The latter protrudes rearwardly from rear vertical face wall 164 of rear upper plate section 133 of X-axis platform 121, in a position offset laterally from the center of the Y-axis platform.

As shown in FIG. 20, cylindrical surface 162 of X-axis cam follower bearing assembly 161 is urged laterally into contact with spiral peripheral surface 158 of cam wheel 157, by a tension spring 165 connected at one end to vertical edge wall 135 of rear upper plate section 133 and at the other end to Y-axis tool support platform 63. Thus, when cam wheel 157 is rotated by X-axis stepper motor 152 in a direction which increases the radius of spiral peripheral cam wheel surface 158, follower 160 and X-axis platform 121 are translated in a first, lateral X-direction which increases the tension in X-axis tension spring 165. Conversely, when X-axis stepper motor 152 is rotated in the opposite direction, tension in spring 165 causes follower 160 to press against a smaller radius region of peripheral cam wheel surface 158, thus pulling Y-axis tool support platform 121 in a second X-direction opposite to the first X-direction. As mentioned previously, positioning mechanism 41 of automatic bonding machine 40 also includes a Z-axis tool support platform 122 which is rollably translatable in a vertical, or Z-direction relative to X-axis tool support platform 121. The structure and function of Z-axis tool support platform 122 may be best understood by referring to FIGS. 14–20.

As shown in FIGS. 14 and 16, X-axis tool support platform 121 includes a vertically disposed Z-axis bearing support plate 136 which has a generally rectangular shape and which protrudes perpendicularly downwards from rectangular boss 134 which in turn protrudes horizontally forward from rear upper plate section 133 of the X-axis tool support platform. As may be seen best by referring to FIGS. 4 and 16, Z-axis bearing support plate 136 has formed in both the left and right front vertically disposed corner walls 172 thereof an L-shaped channel 173 which penetrates both front vertical face wall 174 and left and right vertical side walls 175L, 175R of the bearing support plate. Each of the two laterally opposed, parallel vertically disposed channels 173 in bearing support plate 171 has mounted therein a vertically disposed, square cross-section linear bearing way 176. As shown in FIG. 16, the laterally outwardly outer facing vertically disposed wall 177 of each bearing way 176 has formed therein a vertically disposed, generally V-shaped bearing groove 178.

Figure 17:
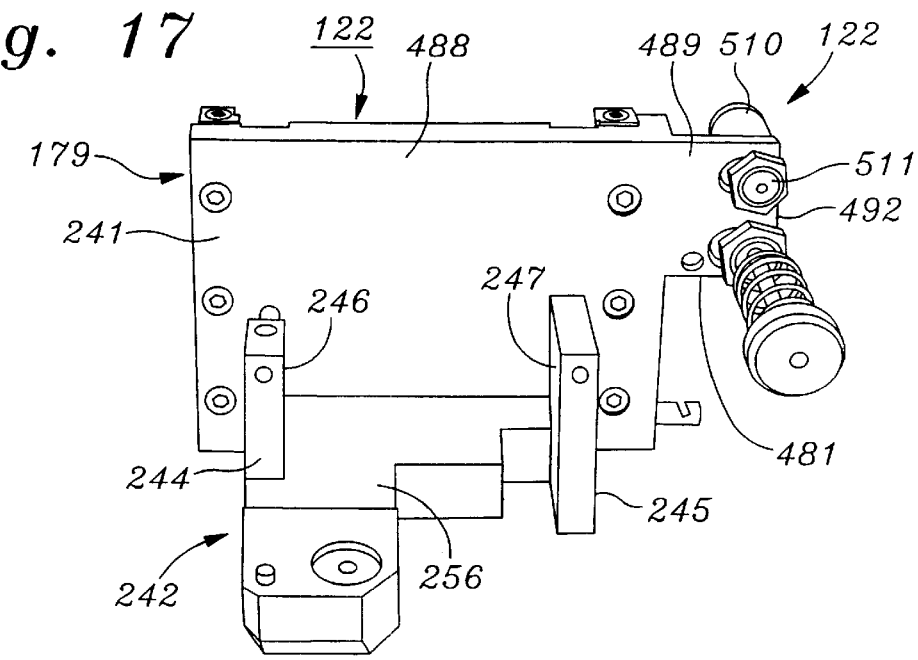
FIG. 17 is a front perspective view of a third, Z-axis tool support platform of the apparatus of FIG. 2.
Figure 19:
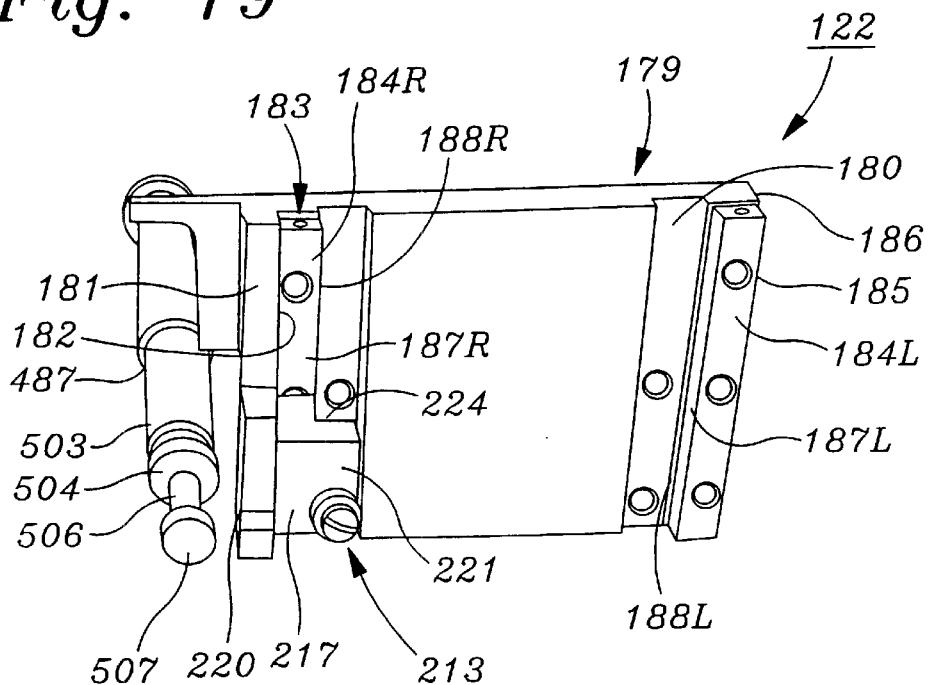
FIG. 19 is a rear perspective view of the Z-axis tool support platform of FIG. 17.

Referring now to FIGS. 17 and 19, it may be seen that Z-axis tool support platform 122 has a rear vertically disposed plate portion 179. As shown in FIG. 19, rear vertically disposed plate portion 179 of Z-axis tool support platform 122 has a generally rectangular shape, and has protruding rearwardly from rear surface 180 thereof a vertically disposed, rectangular cross-section edge rib 181. A laterally inward, vertically disposed surface 182 of edge rib 181 forms with adjacent rear surface 180 of plate 179 an L-shaped channel 183. The latter has mounted thereon a vertically disposed, square cross-section bearing way 184R. As is also shown in FIG. 19, a bearing way 184L is mounted on rear face 180 of plate 179, parallel to and laterally aligned with bearing way 184R, with the outer vertical surface 185 of the bearing way coplanar with left edge wall 186 of the plate. Each of the two laterally inwardly facing vertically disposed walls 187R, 187L of bearing ways 184R and 184L has formed therein a vertically disposed, generally V-shaped bearing groove 188R, 188L, respectively.

Figure 18:
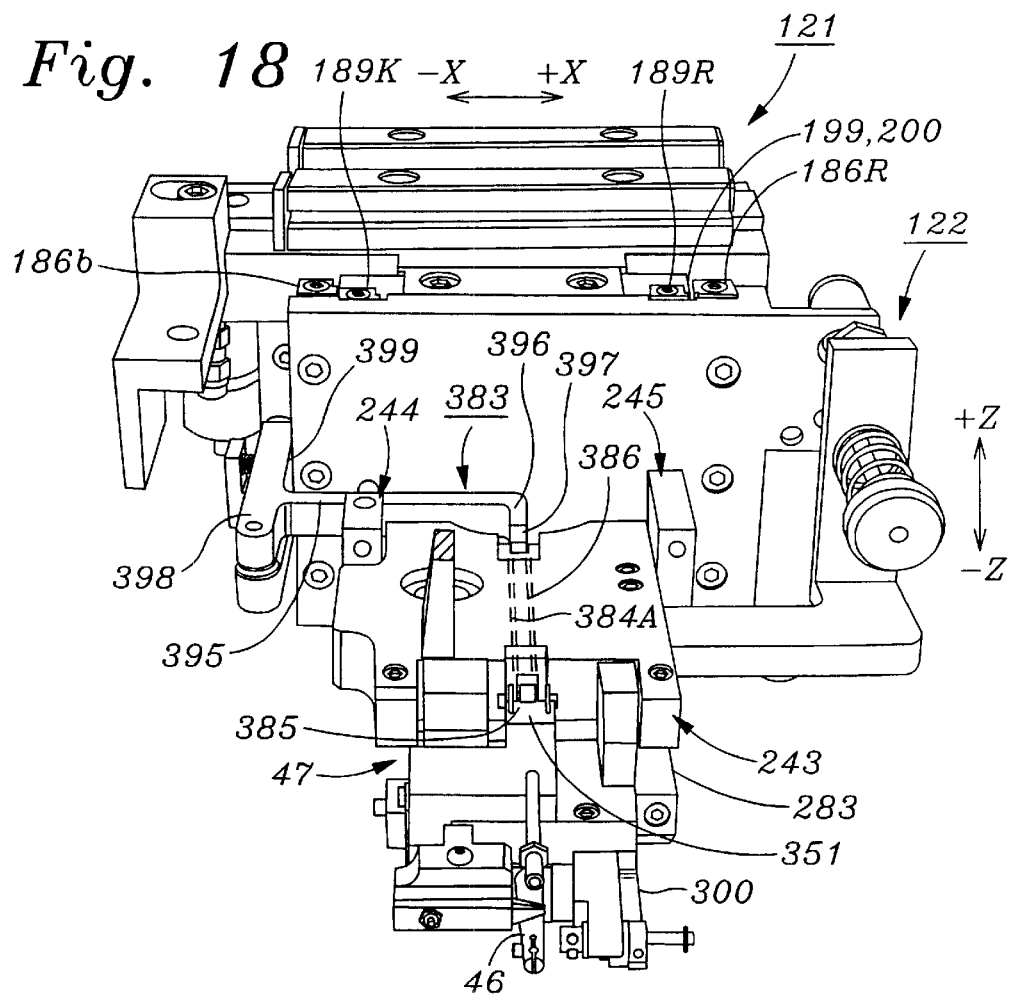
FIG. 18 is a fragmentary front perspective view of the apparatus of FIG. 2, showing the Z-axis tool support platform of FIGS. 17, a rear transducer mount support plate fastened to the front of the Z-axis tool support platform, a transducer mount assembly fastened to the front of the rear transducer mount support plate, and showing the Z-axis tool support platform fastened to the front of the X-axis tool support platform of FIG. 14.

Referring now to FIGS. 18 and 20, it may be seen that Z-axis tool support platform 122 is mounted on the front of Z-axis bearing support plate 136, with tool support platform bearing ways 184 protruding rearwardly from rear plate portion of the tool support platform positioned laterally between bearing ways 176 protruding forwardly from the Z-axis bearing support plate. The lateral spacing between the outer vertical wall surfaces 177 of bearing ways 176 of Z-axis bearing support plate 136 is slightly less than the lateral spacing between inner vertical wall surfaces 187 of Z-axis tool support platform bearing ways 184. Thus arranged, V-shaped groove 188 in the inner facing vertical wall 187 of each outer, Z-axis tool support platform bearing way 184 is laterally aligned with an adjacent V-shaped groove 178 in the outer vertical wall 177 of an inner, Z-axis bearing support plate bearing way 176, forming therewith a vertically disposed, composite Z-axis bearing groove 177, 188 having a generally square transverse cross-sectional shape.

Figure 23:
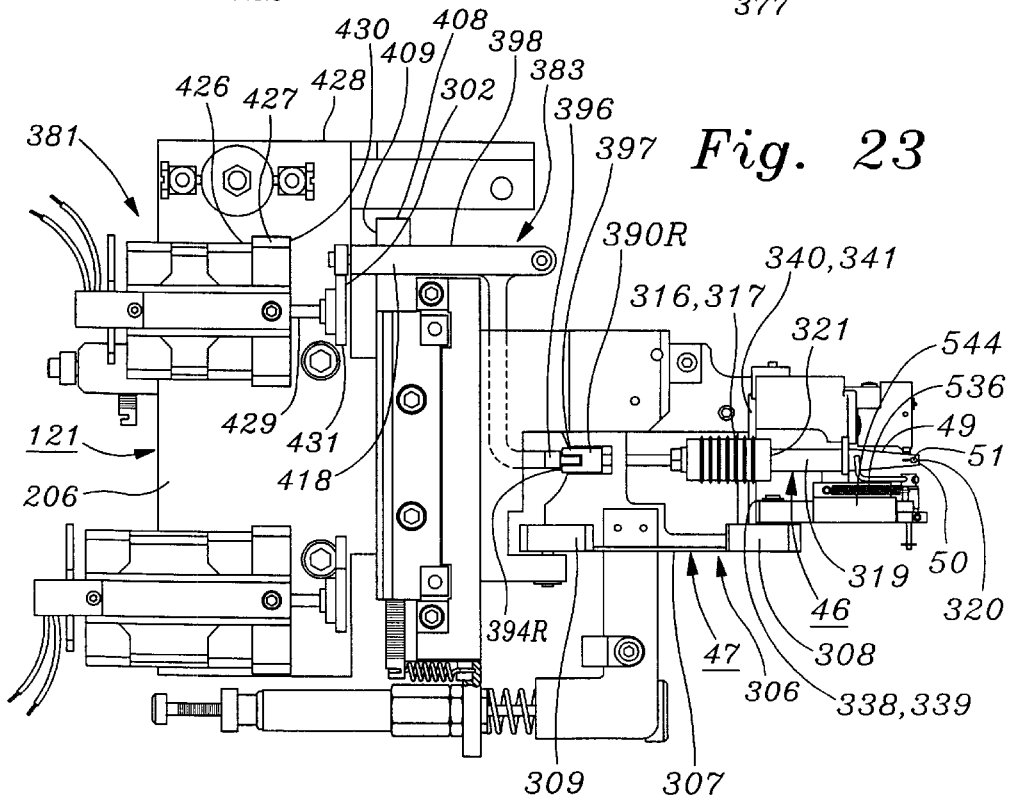
FIG. 23 is a lower plan view of the structure of FIG. 20.

As shown in FIGS. 17, 20 and 23 each of the two Z-axis composite bearing grooves 177,188 holds therein a longitudinally elongated roller bearing cage 199. Each roller bearing cage 199 holds a row of longitudinally spaced apart, cylindrical roller bearings 200. The combination of each Z-axis bearing support plate bearing way 176, Z-axis tool support platform bearing way 184, cylindrical roller bearing cage 199, and cylindrical roller bearings 200 comprises a separate one of a pair of Z-axis tool support platform bearing assemblies 201 which enables vertical or Z-axis translational motion between the Z-axis tool support platform and Z-axis bearing support plate 136 of X-axis tool support platform 121, with a minimum of static and rolling friction, and a minimum degree of lateral and longitudinal run-out.

Components of a Z-axis drive mechanism 202 used to drive Z-axis tool support platform 122 in a vertical or Z-axis direction are shown in FIGS. 15, 16, 19, 20, and 27.

Figure 27:
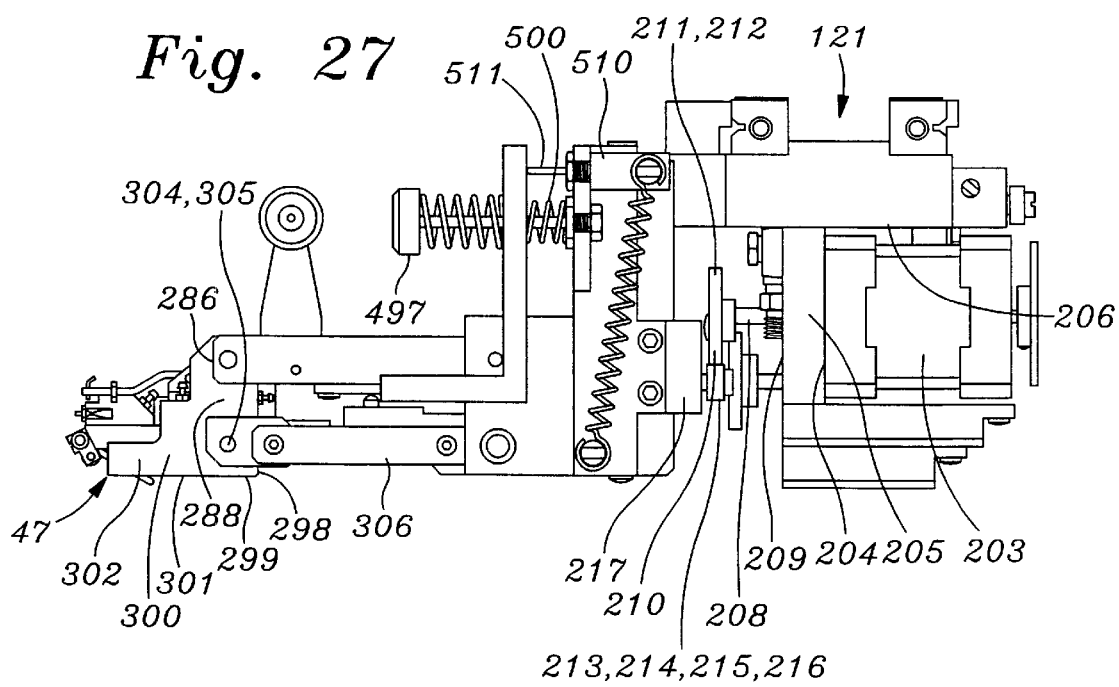
FIG. 27 is a left side elevation view of the structure of FIG. 20.

As shown in FIGS. 15 and 27, Z-axis tool support drive mechanism 202 includes a Z-axis stepper motor 203 which has a front housing end plate 204 bolted to a support plate 205 which protrudes perpendicularly downwards from lower surface 206 of X-axis tool support platform 121. As shown in FIGS. 20 and 27, Z-axis motor support plate 205 is laterally disposed and located longitudinally near the transverse center plane of the X-axis platform, near the right edge wall 207 thereof. Output shaft 208 of Z-axis stepper motor 203 is disposed longitudinally and parallel to lower surface 206 of X-axis tool support platform 121, and protrudes forward of front face wall 209 of motor support plate 205. The protruding end of Z-axis motor output shaft 208 has pinned thereto a cam wheel 210 of uniform thickness. Cam wheel 210 has over a substantial portion of its angular extent, e.g., 270 degrees, a spiral peripheral surface 211, the radius of which varies linearly as a function of polar angle. Angular rotation of stepper motor 203 is limited by software control in both clockwise and counterclockwise directions to a total rotation of less than 270 degrees; accordingly, the unused portion of the peripheral cam wheel surface is truncated by a flat 212.

As may be seen best by referring to FIG. 27, Z-axis drive mechanism 202 includes a cam follower 213. The latter includes a ball bearing assembly 214 which has a smooth outer cylindrical shell surface 215. Ball bearing assembly 214 is mounted on a longitudinally disposed axle 216 which protrudes rearwards perpendicularly from the rear surface 218 of L-shaped angle bar 217.

As shown in FIGS. 19 and 27, L-shaped right angle bar 217 has a front longitudinally disposed portion which is offset inwardly from right edge wall 220 of Z-axis tool support platform 122, and laterally inwardly angled rear portion 221. The vertically disposed, laterally inwardly located side 222 of front angle bar leg 219, and the front vertically disposed face 223 of rear angle bar leg 221 form therebetween a channel 224 which provides clearance for the right edge wall 225 of Z-axis bearing support plate 171, thus allow unimpeded vertical motion of the Z-axis tool support platform relative to the Z-axis bearing support plate.

As shown in FIGS. 20 and 27, cylindrical surface 215 of bearing assembly 214 of Z-axis cam follower 213 is urged vertically upwards into contact with spiral peripheral surface 211 of Z-axis cam wheel 210, by a tension spring 226. The latter has an upper end loop 227 which is hooked into a notch 229 formed in the end of a stud 228 which is threaded into a bore 230 in the upper right side 231 of Z-axis of bearing support plate 136. Tension spring 226 is disposed downwardly and forwardly from stud 228 protruding from Z-axis bearing support plate 136, and has a lower end loop 232 which is hooked into a notch 234 formed in the end of a stud 233 which is threaded into a bore 235 in the lower right side wall 236 of Z-axis tool support platform 122. With this arrangement, when Z-axis cam wheel 210 is rotated by Z-axis stepper motor 203 in a direction which increases the radius of spiral peripheral cam wheel surface 211 at its tangent contact point with cam follower surface 215, cam follower 213 and Z-axis tool support platform 122 are translated in downward Z-axis direction which increases tension on Z-axis tension spring 226. Conversely, when cam wheel 210 is rotated in the opposite direction by Z-axis stepper motor 203, tension in spring 226 causes cam follower 213 to press against a smaller radius region of peripheral cam wheel surface 215, thus causing tension spring 226 to pull Z-axis tool support platform 122 in an upward Z-axis direction.

FIGS. 17 and 18 illustrate structural components of automatic bonding machine 40 which are used to couple Z-axis positioning mechanism 61 to ultrasonic transducer 46.

Referring first to FIG. 17, A may be seen that Z-axis tool support plafforml 122 has protruding forward from front surface 241 thereof a block-shaped support structure 242 for pivotably supporting a rear transducer mount support plate 243. As shown in FIGS. 17 and 18, support structure 242 has a pair of laterally opposed left and right vertically disposed, parallel buttress walls 244 and 245, respectively, that have inner parallel vertical wall surfaces 246 and 247, respectively, between which is pivotably mounted the rear end portion of a plate-like rear transducer mount support plate 243. As shown in FIGS. 17 and 20, rear transducer mount support plate 243 has left and right rear parallel vertical side walls 248 and 249, respectively. Near rear vertical edge wall 250 of rear transducer mount support plate 243, left and right side walls 248 and 249 of rear transducer mount support plate 243 are provided with blind bores 251 in which are fitted annular ring-shaped ball bearing assembles 252. Each of these has a central aperture 253 which receives a separate one of a pair of conical bearing pins 254 that protrude laterally inwards from left and right inner side walls 246, 247, of support structure 242. This construction provides a first pair of laterally opposed and aligned, upper rear pivot joints which enable rear transducer mount support plate 243 to pivot vertically with respect to support structure 242 and Z-axis platform 122.

Figure 24:
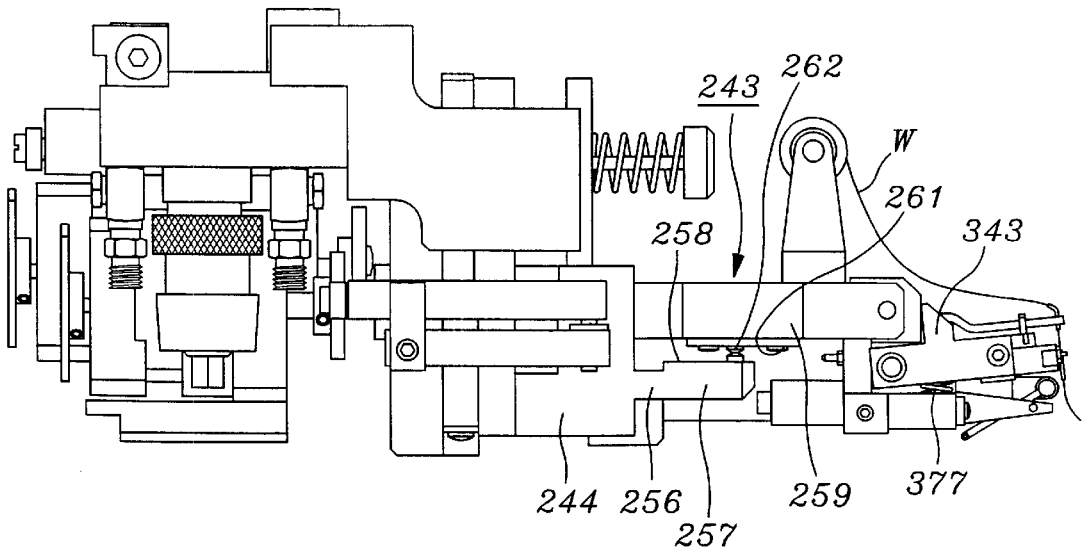
FIG. 24 is a left side elevation view of the structure of FIG. 20.

As may be seen best by referring to FIG. 17, left buttress wall 244 of support structure 242 has protruding forward and laterally inwardly from a lower portion thereof a support table 256 which underlies transducer mount support plate 243. As shown in FIGS. 9, 17, 24, and 26, support table 256 has generally flat and horizontal lower and upper surfaces 257 and 258, respectively, the latter underlying a longitudinally disposed, left-hand bar-like portion 259 of rear transducer mount support plate 243. As shown in FIGS. 24 and 26, left-hand bar 259 of rear transducer mount support plate 243 has attached to the lower surface 260 thereof an electrically insulating, rectangular sheet 261 on which is affixed an upper electric contact button 262. The latter is in vertical alignment and electrical contactibility with a lower electrical contact button 263 which caps an insulating stud 264 that protrudes upwards from support structure table 256.

Referring now to FIGS. 8 and 20, it may be seen that rear transducer mount support plate 243 has formed in the front vertical face wall 243F thereof a laterally elongated and centrally located rectangularly shaped, shallow notch 278. As shown in FIG. 20, notch 278 has an inner laterally disposed vertical inner or rear edge wall 279, and longitudinally disposed left and right vertical inner side edge walls 280L, 280R, respectively, which perpendicularly intersect the rear inner edge wall and front vertical face wall 277 of rear transducer mount support plate 243. Left and right inner side walls 280L, 280R are located equidistant from left and right outer side walls 281L, 281R, respectively, of rear transducer mount support plate 243, forming therewith and the uncut portion of front vertical face wall 277 a pair of left and right, short, laterally spaced apart, longitudinally disposed parallel rectangular bar-shaped arms 282L, 282R which protrude forward from rear transverse edge wall 279 of notch 278.

Figure 28:
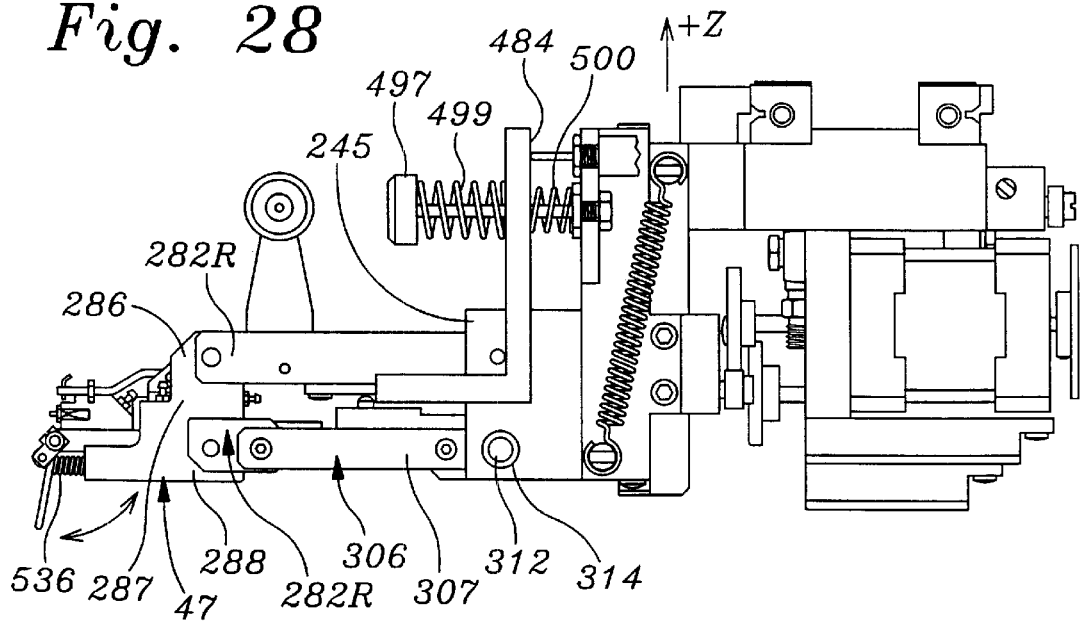
FIG. 28 is a right side elevation view of the structure of FIG. 20 similar to that of FIG. 27, but showing an electronic flame-off torch thereof pivoted downwardly.
Figure 29:
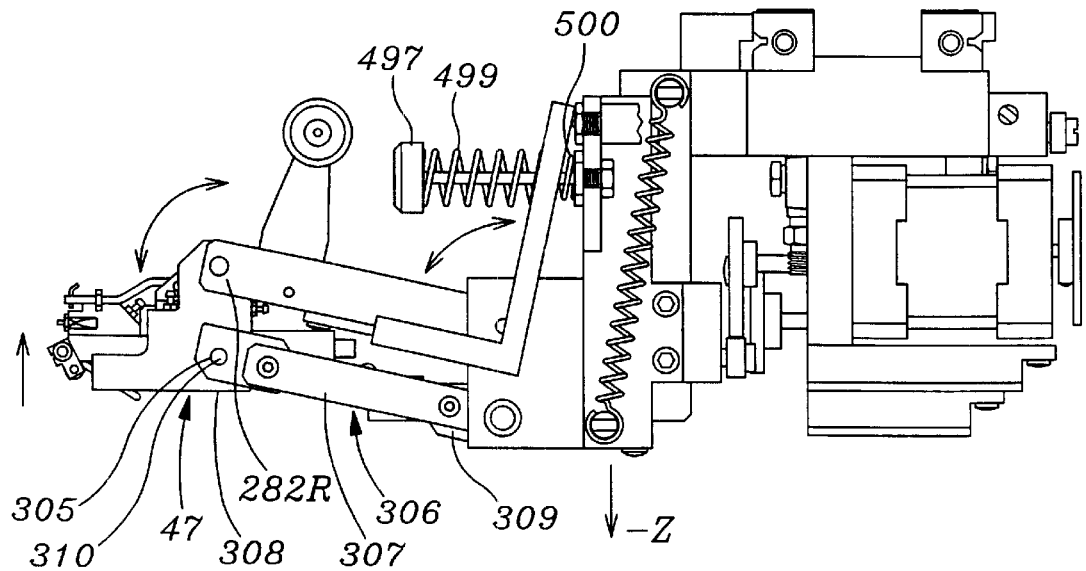
FIG. 29 is a view similar to that of FIG. 27, but showing a transducer mount assembly thereof pivoted fully upwards.

As shown in FIGS. 8, 26, 28, and 29, front transducer mount assembly 47 is pivotably mounted between front arms 282L, 282R of rear transducer mount support plate 243. As shown in FIGS. 8 and 26, transducer mount assembly 47 includes a rear generally rectangularly shaped base plate section 283 which has protruding perpendicularly upwards from upper surface 284 thereof a pair of laterally spaced apart, vertically disposed left and right web sections 285 and 286, respectively, which function as left and right vertical coupling bars. As shown in FIG. 8 and 28, right vertical coupling bar 286 of transducer mount assembly 47 has an outer, right-hand vertical face 287 which is coextensive with a lower portion 288 of the transducer mount assembly located below base plate section 283. As shown in FIG. 20, right coupling bar 286 also has an inner face 289 which is disposed parallel to outer face 287 thereof.

Referring now to FIGS. 8 and 26, it may be seen that left coupling bar 285 of transducer mount assembly 47 has an outer, left-hand vertically disposed face 290, and an inner face 291 parallel to the outer face, forming therebetween a vertically disposed plate of greater thickness than that of right-hand coupling bar 286.

As shown in FIGS. 8, 17, 20, and 26, left and right rear transducer mount assembly coupling bars 285 and 286 have horizontally disposed, coplanar upper faces 292 and 293, respectively. As is also shown in those figures, outer lateral faces 290 and 287 of left and right rear coupling bars 285 and 286, respectively, have protruding inwardly therefrom a pair of laterally opposed and transversely aligned bearing bores 294. An annular ring-shaped ball bearing assembly 295 is pressed into each of the two ball bearing bores. Each of the two ball bearing assemblies has a central aperture 297 which receives a separate one of a pair of conical bearing pins 297 which protrude laterally inwards from left and right inner side walls 280L and 280R of left and right arms 282L, 282R of rear transducer mount support plate 243. This construction provides a second pair of laterally opposed and aligned, upper front pivot joints which enable transducer mount assembly 47 to pivot vertically with respect to rear transducer mount support plate 243.

As may be seen best by referring to FIGS. 8, 9, 20, 23, and 25–27, machine 40 includes additional components for pivotably coupling together Z-axis tool support platform 122, rear transducer mount support plate 243, and transducer mount assembly 47. Thus, as shown in FIG. 27, lower web portion 288 of right-hand coupling bar 286 of transducer mount assembly 47 has a generally flat, vertically disposed rear face 298. Also, lower extension 288 of right-hand coupling bar 286 has a flat, horizontally disposed lower face 299 which perpendicularly intersects rear face 298 of the coupling bar and its lower extension. As shown in FIG. 27, lower extension 288 of right-hand coupling bar 286 has protruding perpendicularly forwards therefrom a forward protruding right bar-like leg section 300 which has a flat lower surface 301 coextensive with flat lower surface 299 of the lower coupling bar extension, a flat outer, right-hand face 302 coextensive with outer face 287 of the right-hand coupler bar, and a flat inner face 303 coplanar with inner face 289 of the right-hand coupler bar. As shown in FIG. 27, lower extension 288 of right-hand coupler bar 286 has disposed laterally through its thickness dimension, near the lower rear corner intersection of lower surface 308 and rear surface 291 thereof, a bore 304 which receives a bearing assembly 305.

Coupling between transducer mount assembly 47 and Z-axis tool support platform 122 includes a right, lower, fore-and-aft or longitudinally disposed lower horizontal linkage bar 306. As shown in FIGS. 23 and 27, lower horizontal linkage bar 306 includes a relatively long thin, central portion 307 consisting of a rectangular plate having parallel vertical side walls, which is rigidly fastened at front and rear ends thereof to relatively shorter, thicker front and rear generally rectangularly shaped coupler blocks 308 and 309, respectively. Front coupler block 308 of linkage bar 306 is coupled near the front end thereof to bearing assembly 305 by a bearing pin 310 which protrudes laterally inwards from inner wall surface 311 of the front coupler block into the bearing assembly. This arrangement provides a third, lower front pivot joint which enables transducer mount assembly 47 to pivot vertically with respect to lower horizontal linkage bar 306.

Referring still to FIGS. 23 and 27, it may be seen that rear coupler bar 309 of linkage bar 306 is pivotably coupled to right-hand buttress wall 245 of block 242 of Z-axis tool support platform 122. This coupling includes a lower rear bearing pin 312 which protrudes laterally outwards from outer wall surface 313 of rear coupler block 309 into a bearing assembly 314 fitted in a bore 315 provided through right buttress wall 245, near the lower front corner edge thereof. This arrangement provides a fourth, lower rear pivot joint which enables lower horizontal linkage bar 306 to pivot vertically with respect to Z-axis tool support platform 122.

Figure 25:
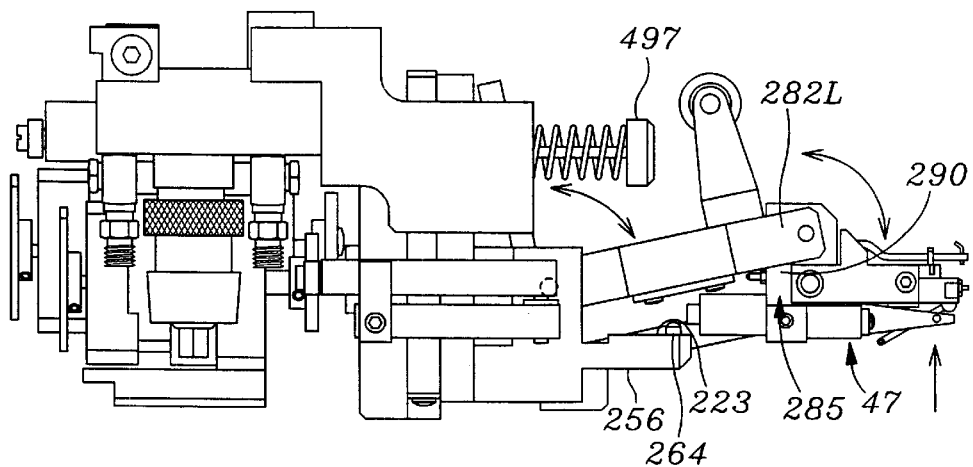
FIG. 25 is a view similar to that of FIG. 24, but showing a transducer mount assembly thereof pivoted fully upwards.

Referring now to FIG. 23, it may be seen that transducer mount assembly 47 has mounted thereto an ultrasonic force-producing transducer 46. As shown in FIG. 23, transducer 46 includes a rear cylindrically shaped stack 316 of piezoelectric disks 317 electrically energizable via electrical terminals 318. Transducer 46 also has projecting coaxially forward from stack 316 an elongated impedance-matching, vibration-coupling horn 319 which has circular cross-section that tapers forward to a front transversely disposed circular end face 320 which is smaller in diameter than rear face 321 of the horn. As shown in FIG. 25, front end portion 322 of horn 319 has therethrough a vertically disposed, circular cross-section tool holder bore 323 which is penetrated longitudinally by a laterally centrally located, vertical slot 324 that also penetrates front end face 320 of the horn, thus forming a pair of laterally opposed jaw halves for springily receiving the shank 325 of a bonding tool 326. Horn 319 also preferably is provided with a set screw 327 threaded into a threaded bore 328 disposed transversely through a jaw half of the horn, rearward of the tool holder bore.

Figure 9A:
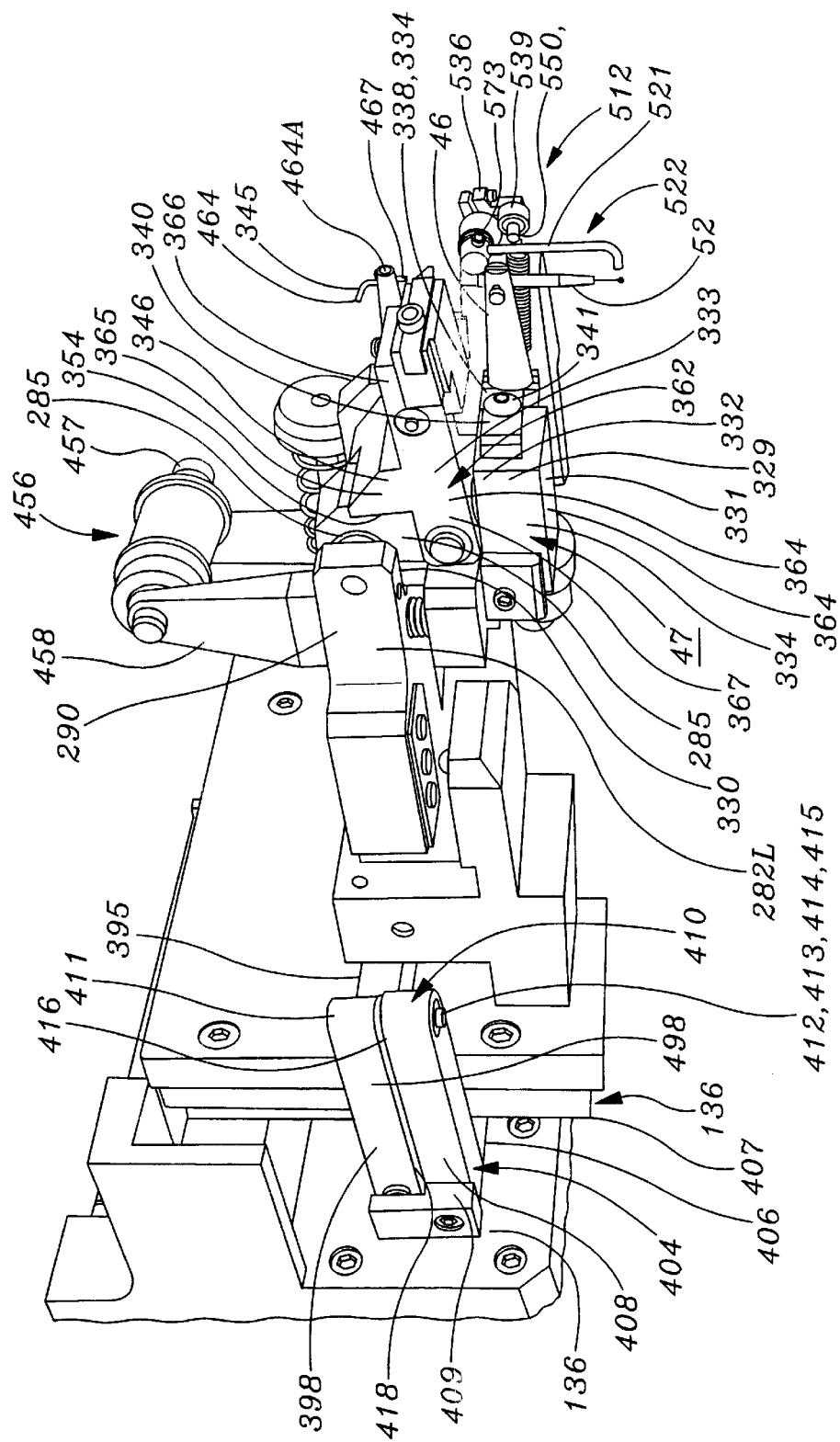
FIG. 9A is a lower left front perspective view of the structure of FIG. 8.

Referring still to FIGS. 8, 9 and 25, it may be seen that left rear vertically disposed coupling bar 285 of transducer mount assembly 47 has a generally flat, vertically disposed rear face 330. Also, the lower end portion 329 of left rear coupling bar 285 has a flat, horizontally disposed lower face 331 which perpendicularly intersects rear face 330 of the coupler bar. As shown in FIG. 9, the lower end portion 329 of left-hand coupler bar 285 has protruding perpendicularly forward therefrom a forward protruding, table-like section 332 which has a flat lower surface 333 coextensive with lower surface 331 of the lower portion of the coupling bar, and a flat outer face 334 coextensive with outer face 290 of the coupling bar. As shown in FIGS. 8 and 25, table 332 is wider than left-hand coupling bar 285, having a longitudinally disposed inner vertical edge wall 335 which is parallel to but laterally inward of inner vertical face 295 of the coupling bar. As shown in FIG. 9A, table 332 has a generally flat vertical, transversely disposed rear face 336 and a similarly shaped front face 337.

As shown in FIGS. 9 and 23, horn 319 of piezoelectric force transducer 46 is welded into a circular bore 338 provided through the thickness dimension of a rectangularly shaped transducer mounting plate 339. Mounting plate 339 is disposed perpendicularly to the longitudinal axis of horn 319, and is positioned longitudinally on the horn at a junction between the more uniformly cylindrical rear portion of the horn and the tapered front portion of the horn, at a transverse nodal plane where the amplitude of ultrasonic vibrations launched into the horn by electrical energization of piezoelectric stack 316 is at a minimum. Mounting plate 339 protrudes transversely, i.e., radially outwards from horn 319, and the outer transverse part of the mounting plate is secured to front face 337 of table 332 by a bracket 340 and screw 341.

Figure 21:
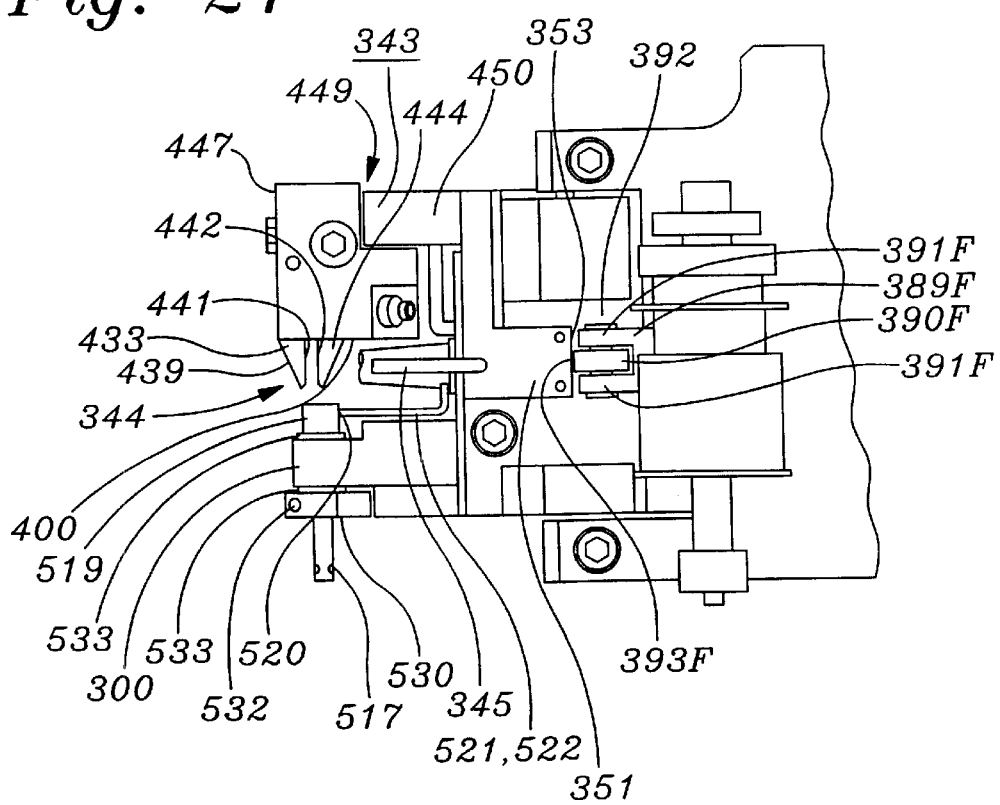
FIG. 21 is a fragmentary view of the structure of FIG. 20, but on an enlarged scale and showing jaws of a wire clamp thereof in a separated, unclamped disposition.

Referring now to FIGS. 8, 9,21, and 26, it may be seen that automatic bonding machine 40 includes an actuating system indicated generally by the numeral 62, which includes individual actuating mechanisms that interact with a length of bonding wire W and cooperate with positioning mechanism 61 to form ultrasonic bonds using the wire. As shown in FIGS. 21 and 26, actuating mechanism system 62 includes a support body 343 on which is mounted a wire clamp 344 and drag tube 345. Body 343 is pivotably mounted on and protrudes forward from left-hand vertical transducer mount support bar 285.

As may be seen best by referring to FIG. 26, wire clamp and drag tube support body 343 has an upper rear generally laterally disposed, transverse web section 346 which is located generally above a generally rectangular shaped horizontally disposed intermediate platform 347 which is a part of ultrasonic transducer mount assembly 47. As shown in FIGS. 8, 21 and 25, intermediate platform 347 has a generally rectangular plan view shape, and protrudes laterally inwards from right-hand rear vertical coupling bar 286 of transducer mount assembly 47. Platform 347 has a generally flat lower face 348 which is located higher than transducer support table 332, and partially overlies ultrasonic transducer 40. Also, platform 347 has a vertically and longitudinally disposed left-hand face 349 which is located laterally inwards of outer, left-hand face 290 of left-hand coupling bar 285, and has a front transversely disposed vertical face 350 which is laterally aligned with the front face of transducer horn mounting plate 332.

Referring now to FIGS. 8 and 26, it may be seen that wire clamp and drag tube support body 343 has a longitudinally disposed, longitudinal web section 351 which protrudes rearwardly from transverse web section 346, the longitudinal web section having a longitudinally disposed right-hand vertical face 352 coextensive with the right-hand side of the body, and a transversely disposed inner or rear vertical face 353 which is parallel to and rearwards of rear vertical face 354 of the transverse web section. As shown in FIGS. 8 and 26, transverse web section 346 of wire clamp and drag tube support body 343 has a short transversely elongated and disposed vertical edge face 355, and a relatively longer front face 356 which is angled obliquely rearward from the front edge face. Angled front face 356 of transverse web section 346 arcuately joins a generally flat, horizontally disposed upper face 357 of longitudinal web section 351. Outwardly or left of left-hand face 353 of longitudinal web section 351, a laterally elongated shallow notch 358 is cut downwards into front face 356 of body 343. Notch 358 has in plan view an L-shape, including a relatively long, transversely disposed inner edge wall 359 which extends from the flat left-hand or outer vertical face 360 of body 343, and a relatively short, longitudinally disposed edge wall 361 coextensive with left-hand vertical wall of longitudinal web section 351.

As shown in FIGS. 9 and 26, wire clamp and drag tube support body 34:3 has a longitudinally disposed, rectangular cross-section strut bar portion 362 located beneath transverse web section 346. Strut bar 362 has a left or outer vertical face 364 contiguous with left or outer face 365 of laterally disposed, triangular cross-section web section 346. Strut bar 362 has a front longitudinal portion 366 which protrudes forward of front vertical edge face 355 of transverse web section 346, and a rear portion 367 which protrudes rearward of rear vertical face 354 of the transverse web section.

As shown in FIGS. 9 and 26, a rectangular shaped clearance notch 369, for receiving rear portion 367 of strut bar 362 is cut laterally inward into a lower portion of left-hand face 290 of left-hand vertical coupling bar 285 of transducer mount assembly 47. Notch 369 has an inner longitudinally disposed vertical end face 370 from which a bearing pin 371 protrudes laterally outwards, where it is received in a bearing journal 372 fitted into a bore 373 provided through the thickness dimension of rear strut bar portion 367, near rear vertical face 374 thereof. Thus arranged, wire clamp and drag tube support body 343 is pivotable upwardly in a vertical direction, to an upper limit imposed by contact of rear vertical face 354 of laterally disposed transverse portion 346 of the support body with the front vertical face wall of left-hand vertical coupling bar 285 of transducer mount assembly 47. Conversely, as shown in FIG. 25, support body 343 is pivotable vertically downwards to a lower limit imposed by contact lower flat surface 376 of strut bar 362 with the upper surface 349 of table extension 332 of coupling bar 285. As shown in FIG. 24, body 343 is resiliently biased to a counterclockwise, upper limit-stop position by a compression spring 377, the upper end of which fits into a blind bore 378 provided in lower surface 376 of strut bar 363, and the lower end of which fits into a blind bore 379 provided in upper surface 344 of transducer clamp table 332.

For reasons which will be described in detail below, machine 40 includes means for pivoting wire clamp and drag tube support body 343 clockwise to precisely prederminable downward positions. Thus, as shown in FIGS. 8, 16, 18, 20, and 24, machine 40 includes an actuator mechanism 380 for pivoting support body 343 which includes a stepper motor 381, a cam wheel 382, a bell crank 383, and a reciprocating push rod 384 which couples motion of the belt crank to the rear vertical face 385 of longitudinally disposed web section 351 of the support body.

Referring now to FIG. 8, it may be seen that reciprocating push rod 384 of pivot actuator mechanism 380 has an elongated circular cross-section shaft 384A which is slidably held within a bore 386 disposed horizontally and longitudinally through rear transducer support plate 243. As shown in FIG. 8, bore 386 is centered laterally in rear transducer mount support plate 243. As may be seen best by referring to FIGS. 8, 26 and 21, rear transducer mount support plate 243 has a pair of front and rear rectangular cross-section notches 338F, 388R concentric with the longitudinal axis of bore 386 which are cut inwardly from inner face wall of larger notch 278 in front face 277, and rear face 388 of the rear transducer mount support plate, respectively. Notches 388 provide clearance for a pair of front and rear clevis blocks, 389 which are fastened to opposite, longitudinal ends of shaft 385 protruding outwardly into the notches. Each clevis block is provided with a cylindrical roller bearing 390 which is mounted between end plates 391 of the clevis, on an axle 392 which is pinned at each opposite end thereof to a separate end plate. Each roller bearing 320 has a cylindrical shell 393 having an outer surface 394 which protrudes outward of the outer transverse edges of clevis plates 391.

As shown in FIG. 21, outer, front surface 394F of a front clevis roller bearing 390F contacts inner or rear vertical wall surface 353 of longitudinal web 351 of wire clamp and drug tube support body 343. Also, as shown in FIG. 23, outer, rear surface 394R of a rear clevis roller bearing 390R is contacted by the front vertical outer face 397 of a finger 396 which protrudes perpendicularly forward from a laterally inwardly disposed output arm 395 of bell crank 383. As shown in FIG. 18, bell crank 383 has of a pair of integral rectangular cross-section arms which intersect at a right angle, including laterally disposed arm 395, and a longitudinally disposed arm 398 which has a longitudinally disposed, vertical inner wall surface 399 that is perpendicularly intersected by an outer lateral end of the laterally disposed arm.

As may be seen best by referring to FIG. 8, longitudinally disposed bell crank arm 398 has a straight bar-shape, including a relatively short front portion 400 which protrudes forward of front face 401 of lateral arm 395, and a relatively long portion 402 which protrudes rearwardly of the rear vertical face 403 of lateral arm 395.

Referring now to FIGS. 9A and 14, it may be seen that longitudinal bell crank arm 398 is pivotably attached to an underlying L-shaped support bar structure 404 which protrudes laterally outward from and forward of left-hand face wall 405 of Z-axis bearing support plate 136. As shown in FIGS. 8, 9A, and 14, bell crank support bar structure 404 includes a short rear, laterally disposed bar 406 which protrudes laterally outward from the left-hand face of Z-axis bearing support plate 136, a short distance above bottom face 407 of the Z-axis bearing support plate. Bell crank support bar structure 404 also includes a relatively long, longitudinal support bar 408 which protrudes perpendicularly forward from the outer longitudinal face 409 of lateral bar 406. Preferably, longitudinal support bar 408 has a front radiused surface 410 which is vertically aligned with a front radiused surface 411 that forms a front face on longitudinal bell crank arm 398. Longitudinal arm 398 of bell crank 383 is pivotably coupled to longitudinal support bar 408 near the front ends thereof by a coupling 412. The latter includes an axle pin 413 which protrudes downwardly through a bore 414 disposed vertically through the outer, front end of longitudinal bell crank arm 398, and through a vertically aligned bore 415 disposed vertically through the outer, front end of longitudinal support bar 408. Coupling 412 includes a thrust washer 415A mounted coaxially over axle pin 414 and which is located between lower surface 416 of longitudinal bell crank arm 398 and upper surface 417 of longitudinal support bar 408.

As may be seen best by referring to FIGS. 8, 9A, 18, 20 and 23, machine 40 includes a bell crank actuator 420 for laterally reciprocatingly driving a rear end portion of longitudinal arm 398 of bell crank 383, thus causing longitudinal reciprocating motion of longitudinally disposed front finger 396 of the bell crank, as well as reciprocating longitudinal motion of push rod 384, resulting in pivoting motion of wire clamp and drag tube support body 343. Thus, as shown in FIG. 23, longitudinal arm 398 of bell crank 383 has a rear longitudinal portion 418 which protrudes rearwards of rear face 419 of support bar 408. As shown in FIGS. 14, 16 and 23, a bell crank cam follower 421 is mounted to rear vertical face 422 of rear portion 418 of bell crank arm. Cam follower 421 includes a ball bearing assembly 423 that has a smooth outer cylindrical shell surface. Ball bearing assembly 423 is mounted on a longitudinally disposed axle 424 which protrudes rearwards from rear face 421 of longitudinal bell crank arm 398.

As shown in FIGS. 15, 16, and 23, bell crank actuator mechanism 420 for pivoting wire clamp and drag tube support body 343 includes a clamp and drag tube stepper motor 381 which has a front housing end plate 426 bolted to a support plate 427 which protrudes perpendicularly downwards from lower surface 206 of X-axis tool support platform 121. Motor support plate 427 is laterally disposed and located longitudinally near the transverse center plane of X-axis tool support platform 421 inward from left-hand face wall 428 of the X-axis tool support surface platform. Motor 381 has an output shaft 429 that is disposed longitudinally and parallel to lower surface 206 of X-axis tool support platform 121, and protrudes forward of front face 430 of motor support plate 426. The protruding end of wire clamp and drag tube stepper motor shaft 429 has pinned thereto a cam wheel 382, which has a uniform thickness. Cam wheel 382 has an eccentric surface 431.

Referring now to FIG. 8, it may be seen that bell crank actuator 420 includes a compression spring 432 for resiliently urging cam follower 424 laterally inwards into contact with cam wheel surface 431. Compression spring 432 is disposed laterally between the outer vertical face 432 of rear longitudinal bell crank arm portion 433, and the inner vertical face 434 of a vertical plate 435 which is offset laterally outwardly from longitudinal bell crank support bar 408, opposite lateral ends of the spring residing in blind fores 435 and 436, respectively, provided in the opposed faces of the bell crank arm and vertical plate, respectively.

With this arrangement, when cam wheel 382 is rotated by stepper motor 3131 in a direction which increases the radius of cam wheel surface 431 at its tangent contact point with cam follower surface 424, cam follower 421 and rear portion 402 of longitudinal bell crank arm 398 are translated in a laterally outward direction which increases a compression in spring 432, and pivots bell crank 383 in a counterclockwise sense as viewed from above, thus causing bell crank finger 396 to retract rearwardly. Also, since bias spring 377 for wire clamp and drag tube body 343 causes the drag tube body to bear against front bearing surface 394F of push rod 384, rear bearing surface 394R of push rod 384 bears against front face 397 of the bell crank finger. Thus, push rod 384 also translates rearwardly, and body 343 pivots rearwardly. Conversely, when cam wheel 382 is rotated in the opposite direction by stepper motor 381, compression in spring 432 causes cam follower 421 to press against a smaller radius region of cam wheel surface 431, causing the compression spring to push laterally inwards on rear portion 402 of longitudinal bell crank arm 398. This action causes bell crank 383 to pivot in a clockwise sense, push rod 394 to be extended, and wire clamp and drag tube support body 343 to pivot downwardly.

As shown in FIGS. 8, 9A, 16, 18, and 20, the novel construction of bell crank actuator mechanism 420 locates heavier components of a pivot actuator means for wire clamp and drag tube support body 343 rearward of transducer mount support plate 47. Moreover, the novel construction of the actuator allows precise pivotable actuation of wire clamp and drag tube support body 343 even as Z-axis platform 122 is translated relative to the Z-axis bearing support plate 171 on which the bell crank actuator motor is located, since rear clevis bearing 393R may roll freely on vertical front face 397 of bell crank finger 396 during vertical translation between the two surfaces, thus maintaining precise longitudinal extension of push rod 384 to effect a precise pivot angle of wire clamp and drag tube support body 343.

Referring now to FIGS. 8, 18, 9, and 21, it may be seen that front longitudinal portion 366 of strut bar 362 of wire clamp and drag tube body 343 has attached thereto al wire clamp 344. Wire clamp 344 includes a front laterally disposed portion 438 that includes a pair of laterally inwardly disposed front and rear clamp jaws 439 and 440. As shown in FIGS. 8, 9B, and 21, clamp jaws 439,440 have laterally disposed, vertical clamping faces 441 and 442, respectively, which are forced tightly together by a spring (not shown). As shown in FIG. 9B, clamp jaws 439, 440 have relatively thicker left-hand or laterally outward root portions 443, 444, which taper to relatively thinner laterally inward end tips 445, 446, respectively. As may be seen best by referring to FIG. 21, outer root portions 443, 444 of front and rear clamp jaws 439, 440 also taper laterally inwards so that tips 445, 446 of the clamp jaws are longitudinally thinner.

Referring now to FIG. 21, it may be seen that body 447 of wire clamp 344 has formed in a left rear portion 448 thereof an L-shaped notch 449 which receives front right corner 450 of front portion 366 of strut bar 362. Wire clamp body 447 is secured to strut bar 362 by a screw 451 which protrudes laterally inwardly through a bore 452 provided through front portion 366 of strut bar 362, the screw engaging a laterally aligned threaded bore 452 in wire clamp body 447.

Body 447 of wire clamp 344 is partially hollow, and contains therein a pneumatic actuator cylinder (not shown) that is coupled internally to clamp jaws 439, 440, and which has an inlet port fitting 454. When the latter is supplied with pressurized air, clamp jaws 439, 440 move longitudinally apart, forming a laterally disposed space 455 between faces 441, 442 of jaws receiving a length of wire W; when pressure is removed from the inlet port, the clamp jaw faces move longitudinally towards one another in response to a clamping force provided by a bias spring (not shown), thus clamping the wire between the jaw faces.

Referring now to FIGS. 8, 9B, and 26, it may be seen that automatic bonding machine 40 includes a wire supply spool 456 rotatably mounted on a transversely disposed horizontal axle 457 which protrudes laterally inwards from a vertical bracket 458 that protrudes perpendicularly upwards from upper surface 459 of rear transducer mount support plate 243. As shown in FIGS. 8 and 26, bracket 458 is positioned adjacent to rear edge wall 279 of notch 278 in front surface 243F of the transducer mount support plate 243, and is laterally offset to the left of a medial longitudinal plane of the transducer mount support plate, thus locating the front cylindrical surface of wire supply spool 456 laterally centered with respect to longitudinal web 351 of wire clamp and drag tube support body 343, and slightly rearward of rear surface 354 of the longitudinal web.

Figure 22A:
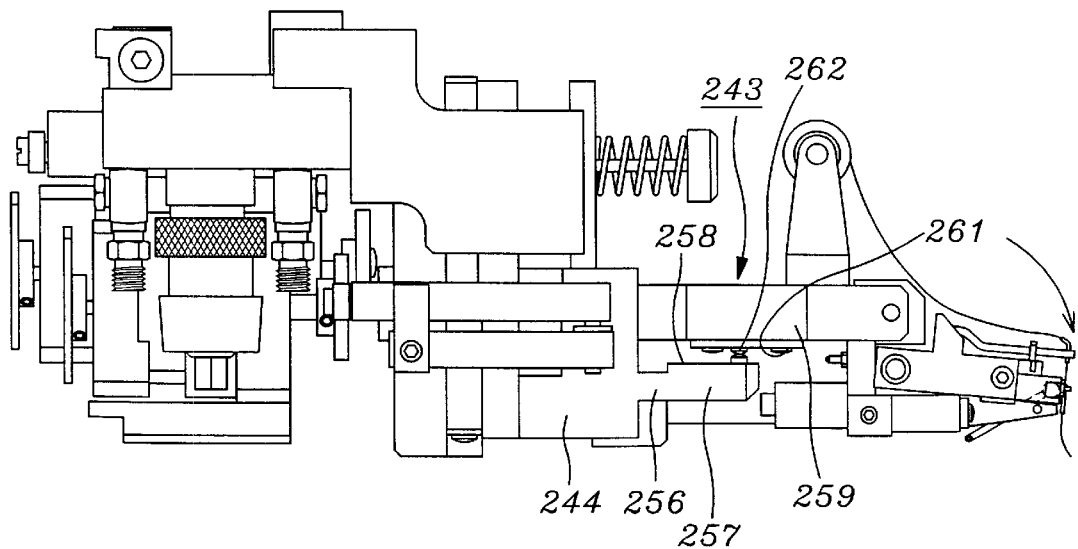
FIG. 22A is a fragmentary left side elevation view of the apparatus of FIG. 2, showing a drag tube/wire clamp platform thereof pivoted downwardly.
Figure 22B:
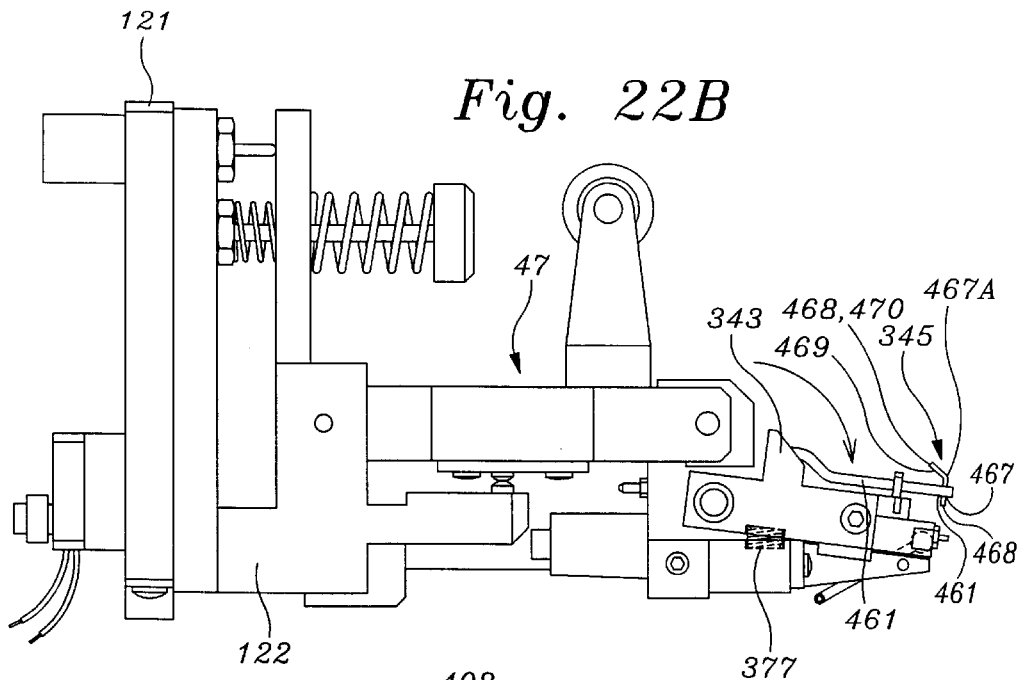
FIG. 22B is a view similar to that of FIG. 22A, but on a somewhat enlarged scale.

Referring now to FIGS. 9A, 22B, and 26, it may be seen that automatic bonding machine 40 includes a drag tube 345 for frictionally resisting motion of wire from spool 456 through the bore of ultrasonic bonding tool 52. This frictional resistance, or drag, is created by a capillary tube through which the wire is drawn. As shown in FIG. 26, drag tube 345 consists essentially of a curved tube having a small diameter, capillary bore. In an example embodiment, drag tube 345 had an outer diameter of 0.028 inch, and a bore diameter of about 0.016 inch, e.g., about 0.0144 inch larger than the 0.00125 inch diameter gold bonding wire machine 40 is intended to be used with. Drag tube 345 is mounted near the front end of a tubular support arm 461 which has a rear portion 462 which protrudes horizontally from a laterally central location of front sloping face 356 of longitudinal web 351 of wire clamp and drag tube support body 343. Drag tube support arm 461 also has an intermediate portion 463 which angles downwardly from rear portion 462, and a front end portion 464 which protrudes horizontally and longitudinally forward from the lower front end of the intermediate portion.

As shown in FIG. 26, front end portion 464 of drag tube support arm 461 has disposed vertically therethrough a bore 465 which is located rearward of front end face 464A. Front end portion 464 of drag tube support arm 461 is located above wire clamp jaws 439, 440. Also, the longitudinal axis of bore 465 is vertically aligned with the vertical contact plane 455 between faces 441 and 442 of clamp jaws 439, 440, with the bore 51 through ultrasonic transducer 46, and therefore with capillary bore 53 through ultrasonic bonding tool 52.

As shown in FIGS. 9A, 22B, and 26, drag tube 345 has a front generally vertically disposed portion 467 which fits conformally within bore 465 of drag tube support arm 461, thus positioning a vertically disposed portion of bore 468 through the drag tube in vertical alignment with capillary bore 53 through ultrasonic bonding tool 52. Drag tube 345 also has a relatively straight upper rear portion 469 which bends arcuately rearward from the upper end of front, lower vertical portion 467 of the drag tube, so that the longitudinal axis of capillary bore 468 at a rear, entrance opening 470 to the bore makes an angle of about 60 degrees to the vertically oriented longitudinal axis of the bore at its lower exit opening 471. As shown in FIG. 22B, front vertical portion 467 and rear angled portion 469 of drag tube 345 are joined by an arcuately curved, or bent, transition section 467A. In an example embodiment, transition section 467A had an outside bend radius of about 0.0625 inch. With the aforementioned capillary bore of 0.016 inch through drag tube 345, gold bonding wire having a diameter of 0.00125 inch is bent sufficiently in transition section 467A for substantial frictional force to be created between the capillary bore walls and wire surface, while ensuring that the wire is not bent beyond its elastic limit. As shown in FIG. 26, a pair of laterally opposed vertical wire guide pins 472 protrude upwardly from upper face of longitudinal web section 351 of wire clamp and drag tube support body 343, near opposite longitudinal sides thereof, and near the rear face thereof.

Referring now to FIGS. 8 and 20, it may be seen that automatic bonding machine 40 includes a bonding force adjustment mechanism which enables the remote selection of bonding force exerted on a bond site by the tip of ultrasonic bonding tool 52, to either one of two predetermined values. This novel feature allows ball and wedge bonds, which typically require different bonding forces, to be performed alternately in any desired sequence. That bonding force adjusting mechanism will now be described.

Referring still to FIGS. 8 and 20, it may be seen that rear transducer mount support plate 243 has attached to lower surface 475 thereof a flat arm 476 which protrudes laterally outwards of right side face 477 of the transducer mount support plate. Arm 476 has a laterally elongated, rectangular-shaped inner portion 478 that has flat and parallel, upper and lower horizontal surfaces 479 and 480, respectively. Arm 476 has in an upper plan view an L-shape, including an outer longitudinally disposed portion 481 that is shorter than laterally disposed portion 478, and which protrudes rearward from an outer lateral end portion of the laterally disposed portion. Outer lateral portion 481 has bent perpendicularly upwards from the rear end thereof a transversely disposed, vertical plate section 482 which has flat, transversely disposed vertical front and rear faces 483, 484, respectively.

As shown in FIGS. 8 and 20, vertical plate section 482 of arm 476 has through its thickness dimension a circular hole 485 which has a front counterbore entrance 486F in front face 483, and a rear counterbore entrance opening 486R in rear face 484. Hole 485 is axially aligned with a pneumatic cylinder 487 that is fastened to Z-axis tool support platform 122. Thus, as shown in FIGS. 8 and 20, rear plate section 488 of tool support platform 122 has protruding from the upper right-hand corner portion thereof a rectangular flange portion 489, which has a horizontal upper edge wall, parallel to lower edge wall 481, and vertical right side edge wall 492. Pneumatic cylinder 487 has a cylindrically-shaped body 493 which is mounted in a hole provided through flange plate 489, near the corner intersection between lower edge wall 491 and vertical right side edge wall 492 of the flange plate.

As shown in FIG. 20, body 493 of pneumatic cylinder 487 has protruding axially forward therefrom an elongated piston rod 495 which protrudes forward through hole 485 in upper vertical plate section 482 of arm 476 fastened to rear transducer mount support plate 243. Piston rod 495 has a threaded outer end 496 to which is attached a front compression spring retainer knob 497. The latter has a cylindrical cup-shape, including a blind rear entrance bore 498 which receives the front end of a front helical compression spring 499 that is coaxial with piston rod 495 and disposed laterally rearward over the piston rod, the rear end of the spring being seated in front entrance counterbore 486F of hole 485 through vertical plate section 482 of arm 476. Machine 40 also includes a rear helical compression spring 500 which is disposed longitudinally and coaxially over piston rod 495, the front end of the spring being seated within rear entrance counterbore 486R of hole 485 through vertical plate section 482, and the rear end of the spring being seated coaxially over a hexagonal ring nut 501 which secures a threaded front mounting nose 50 of pneumatic cylinder body 493 to Z-axis tool support platform flange 489.

As shown in FIGS. 8, 19, and 20, body 493 of pneumatic cylinder 487 has a substantially long portion 503 which protrudes rearward of rear face 504 of mounting flange 489. Rear portion 503 of pneumatic cylinder body 493 has a circular end cap 504 which is provided with a coaxial threaded bore 505. The latter threadably receives a relatively long threaded adjustment screw 506 that has at the rear end thereof an enlarged diameter, knurled knob 507.

The inner end (not shown) of screw 506 within cylinder body 493 limits rearward stroke motion of an actuator piston (not shown) when the inlet port 508 of pneumatic cylinder 487 is supplied with pressurized air. Thus, the rearward stroke of piston rod 495 may be adjusted by turning adjustment screw 506, being shorter when the screw is threaded further into cylinder body 493, and longer when the screw is backed rearwardly out the cylinder. Therefore, when pneumatic cylinder 487 is supplied with pressurized air, piston rod 495 is retracted a pre-adjusted distance, causing front retainer knob 497 attached to the front end of the piston rod to retract a pre-determined distance rearward, thereby increasing by an adjustable amount the compression force in front compression spring 497 disposed between the front adjustment knob and vertical arm section 482. As shown in FIG. 27, the increased force exerted rearward on vertical plate 482 of arm 476 attached to rear transducer support plate 243 tends to pivot the latter upwards, thus partially counterbalancing the downward gravitational force exerted on components of transducer mount assembly 47. Therefore, when tool tip 57 of ultrasonic bonding tool 52 contacts a workpiece with pneumatic cylinder 483 energized, the four bar linkage mechanism which supports the transducer from Z-axis platform 122 will push upwardly and open switch contacts to initiate application of ultrasonic bonding energy at a lighter contacting force. As shown in FIG. 20, adjustment screw 506 has threaded thereon a threaded knurled bushing 509 located between rear adjustment knob end 507 of the screw, and rear end cap 504 of cylinder body 493. When knob 506 has been turned to adjust the bonding force to a desired value with cylinder 487 energized, bushing 509 may be tightened against rear end cap 504 to prevent inadvertent rotation of adjustment screw 506 in response to vibrations.

When Z-axis tool support platform 122 of machine 40 is accelerated rapidly downwards during automatic bonding operations, the inertia of the rear transducer mount support plate 243 and transducer mount assembly 47, which are pivotably attached to Z-axis tool support platform 122 by a four-bar linkage, causes the rear transducer mount support plate to pivot upwardly and rearwardly relative to the Z-axis tool support platform. To minimize this undesired motion, which can cause the rear transducer mount assembly to bang against limit stops, rear compression spring 500 exerts a resilient compressive restraining force between Z-axis tool support platform 122 and vertical portion 482 of arm 476 fastened to rear transducer mount support plate 243. As shown in FIG. 17, to further limit inertial pivoting of rear transducer mount support plate 243 relative to Z-axis tool support platform 243, a solenoid 510 having an extendible plunger rod 511 is fastened to flange 489 of Z-axis tool support platform 122, above and vertically aligned with pneumatic cylinder 487. As shown in FIG. 27, prior to rapid downward accelerations of Z-axis platform 122, solenoid 510 is electrically energized in response to software commands, causing plunger rod 511 to be extended into contact with rear surface 484 of vertical plate section 482 of arm 476, thus limiting pivotable motion of rear transducer mount support plate 243 relative to Z-axis tool support platform 122.

Referring now to FIGS. 8, 9A, 9B, 23, 26 and 28, it may be seen that automatic bonding machine 40 includes an electronic flame-off torch 512 which is used to produce an electrical arc discharge to the end of a bonding wire protruding from ultrasonic bonding tool 52, of the proper duration and energy content to melt the wire end and form a ball thereat when the wire end is allowed to cool and resolidify.

As shown in FIGS. 8, 9A, 9B, 21, and 23, electronic flame-off torch 512 is mounted to the front portion of right bar-like leg section 300 protruding forward from the underside of base plate section 283 transducer mount assembly 47. Electronic flame-off (EFO) torch support leg 300 has an upper longitudinally disposed portion 513, the outer end portion 514 of which has a radiused front face 514. As shown in FIGS. 8 and 9B, outer end portion 514 of EFO support leg 300 has flat, parallel laterally opposed vertical side walls 516. A bore 517A disposed transversely through outer end portion 514 of upper support portion 513 of EFO support leg 300 rotatably receives an axle 517. The inner end 518 of axle 517 protruding inwardly of inner vertical side wall 516R of end portion 514 has an enlarged diameter head 519. The latter has a first radially disposed bore 520 which receives a straight, radially disposed shank 521 of an EFO torch conductor rod 522. Shank 521 is secured within bore 520 by a set screw 523 threaded into a threaded bore 524 in head 519 which penetrates and is perpendicular to shank bore 520. As shown in FIG. 9A, shank 521 of EFO bore conductor rod 522 is straight and relatively long, and has at an outer end thereof a short, straight perpendicularly disposed protruding stirrup part 525 which has a flattened outer end 526.

Referring now to FIGS. 8 and 26, it may be seen that axle 517 has an outer end 527 which protrudes outwardly of outer vertical side wall 516 of support leg end portion 514. Attached to outer end 527 of axle 517 is a lever assembly 528 which includes a yoke 529 having a bore 531 which receives the axle, and bifurcated clamp jaws 530 which are tightened to clamp the axle within the bore by a screw 532. A pair of Teflon thrust washers 533 on opposite ends of a Teflon tube located between head 519 and inner side wall 516R, and between lever assembly 528 and outer side wall 518L of support leg end portion 519 allows free rotation of the axle within bore 517A through the end portion.

Referring still to FIGS. 8, 9A, 23, and 26, it may be seen that lever assembly 528 has a radially outwardly protruding torque arm 536. The latter has disposed transversely through an outer radial end thereof a bore 535 which receives in an interference fit a roller support/spring bias axle 536 which protrudes laterally inwards from the torque arm parallel to EFO torch conductor rod axle 517.

As shown in FIG. 23, support leg 300 has below upper longitudinal end portion 513 thereof a shorter, block-shaped portion 537. The latter has a front vertical face 538 which is rearward of and longitudinally aligned with a cylindrical-shaped Teflon roller 539 rollably attached to roller support/spring bias axle 536. Block-shaped portion 537 of EFO support leg 300 has formed therein a bore 540 which extends longitudinally inward from front face 538 of the block, the bore receiving a pneumatic cylinder (not shown). The latter has a piston rod 541 which protrudes longitudinally forward into contact with a rear surface of roller 539.

Roller support/spring bias axle 536 has near an inner end thereof an annular groove 542 which receives the front loop 543 of an elongated helical tension spring 544. The latter has a rear loop 545 which is hooked over a pin 546 which protrudes downward from a rear portion of upper portion 513 of EFO support leg 300. With this arrangement, roller 539 is resiliently urged by tension spring 544 into contact with the outer end of piston rod 541. With piston rod 541 fully retracted, this results in EFO torch conductor rod 522 being pivoted fully rearward, positioning stirrup 525 of the rod below a rear portion of ultrasonic transducer 46. When pressurized air is applied to the pneumatic cylinder, piston rod 541 is extended, pushing forward on roller 539. This causes EFO torch conductor rod 522 to pivot forward against tension in spring 544, thus positioning flattened outer end 526 of EFO torch rod stirrup 523 directly beneath a wire end protruding downward through lower exit opening 56 of capillary bore 53 of ultrasonic bonding tool 52. At this position an electrical arc discharge is produced between EFO torch rod 522 and the tip of a bonding wire, by applying a high voltage to outer end 527 of EFO axle 517, which is electrically isolated from the ultrasonic bonding tool and other machine components which are at ground potential.

Upon completion of a ball-forming a discharge between EFO torch conductor rod stirrup tip 526 and the tip of a bonding wire protruding from ultrasonic bonding tool 52, air pressure on pneumatic cylinder is relieved, allowing tension spring 544 to pivot the EFO torch rearward to its inactive position beneath transducer 46.

What is claimed is:

1. A machine for making ultrasonic wire bonds comprising;
    a. positioning means for translating an ultrasonic bonding tool to thereby position the tip of said tool to precisely pre-determinable positions within a coordinate space, said positioning means including:
        I. a support plate, a first Y-axis tool support platform, means for translatably supporting said first platform by said support plate and first drive motor means for translating said first platform with respect to said support plate, and
        II. a second, X-axis tool support platform, means for translatably supporting said second platform by said first, Y-axis tool support platform, and second drive motor means for translating said second platform with respect to said first, Y-axis tool support platform,
    b. transducer support means for supporting an ultrasonic transducer,
    c. an ultrasonic transducer,
    d. an ultrasonic bonding tool mechanically coupled to said ultrasonic transducer, said bonding tool having a bore therethrough for receiving a bonding wire,
    e. coupling means for coupling said transducer support means to said positioning means, and
    f. actuating means for manipulating bonding wire threaded through a bore provided through said bonding tool.

2. The machine of claim 1 wherein said means for translatably supporting said first platform is further defined as being first linear bearing means.

3. The machine of claim 1 wherein said means for translatably supporting said first platform is further defined as being second linear bearing means.

4. The machine of claim 1 wherein said positioning means is further defined as including a third, Z-axis tool support platform, means for translatably supporting said third platform by said second, X-axis tool support platform, and third drive motor means for translating said third platform with respect to said second, X-axis tool support platform.

5. The machine of claim 4 wherein said means for translatably supporting said first platform is further defined as being third linear bearing means.

6. The machine of claim 4 further including coupling means supporting said transducer support means by said third, Z-axis tool support platform.

7. The machine of claim 1 wherein said first drive motor means is further defined as comprising in combination a first rotary motor fixed to said support plate, a lead screw rotatable by said first motor, and a threaded follower block threadably engaged by said lead screw and fixed to said Y-axis tool support platform.

8. The machine of claim 1 wherein said second drive motor means is further defined as comprising in combination a second rotary motor fixed to said Y-axis tool support platform, a first cam wheel fastened to the shaft of said motor, a first cam follower attached to said X-axis tool support platform and means for urging said first cam follower into contact with a peripheral surface of said first cam wheel.

9. The machine of claim 4 wherein said third drive motor means is further defined as comprising in combination a third rotary motor fixed to said X-axis tool support platform, a second cam wheel fastened to the shaft of said motor, a second cam follower attached to said Z-axis tool support platform and means for urging said second cam follower into contact with a peripheral surface of said second cam wheel.

10. The machine of claim 6 wherein said coupling means is further defined as enabling relative motion between said transducer support means and said positioning means.

11. A machine for making ultrasonic wire bonds comprising;
    a positioning means for translating an ultrasonic bonding tool to thereby position the tip of said tool to precisely pre-determinable positions within a coordinate space,
    b. transducer support means for supporting an ultrasonic transducer, c. an ultrasonic transducer, d. an ultrasonic bonding tool mechanically coupled to said ultrasonic transducer, said bonding tool having a bore therethrough for receiving a bonding wire, e. coupling means for coupling said transducer support means to said positioning means, and f. actuating means for manipulating bonding wire threaded through a bore provided through said bonding tool and forming a fusion ball at an end of said bonding wire, said actuating means comprising;
  (i) means for pressing a tip of said bonding tool against a bonding site with a pre-determined contact force,
  (ii) means responsive to said tip contacting said bonding site with a pre-determined force in energizing said ultrasonic transducer,
  (iii) means for gripping said bonding wire at a location between an upper entrance opening to said bore of said bonding tool and a wire supply spool,
  (iv) means for moving said bonding tool away from said bonding site to sever an end of said bonding wire thereat,
  (v) means for advancing said wire through said bore of said bonding tool to thereby position said severed end of said wire a pre-determined protrusion distance from said bonding tool tip,
  (vi) means for forming at said severed wire end a fusion ball, said means being spaced a pre-determined distance from said protruding severed end of said bonding wire, and
  (vii) means for exerting a rearwardly directed tension force on a portion of said wire rearward of said bonding tool, whereby said wire is pulled inwardly in said bonding tool bore to thereby seat said fusion ball on an outer, lower front work face of said tool.

12. The machine of claim 11 wherein said positioning means is further defined as comprising in combination:
  a. a support structure,
  b. at least a first tool support platform,
  c. means for translatably supporting said first tool support platform by said support structure, and
  d. first drive motor means for translating said first tool support platform relative to said support structure.

13. The machine of claim 12 wherein said positioning means is further defined as including:
  a. a second tool platform,
  b. means for translatably supporting said second tool support platform by said first tool support platform, and
  c. second drive motor means for translating said second tool support platform relative to said first tool support platform.

14. The machine of claim 13 wherein said support structure, said first tool platform, and said second tool support platform comprise a vertically downwardly tiered sequence of members.

15. The machine of claim 13 wherein said positioning means is further defined as including;
  a. a third tool support platform,
  b. means for translatably supporting said third tool support platform by said second tool support platform, and
  c. third drive motor means for translating said third tool support platform relative to said first tool support platform.

16. The machine of claim 15 wherein said coupling means is further defined as joining said third tool support platform to said transducer support means.

17. The machine of claim 16 wherein said coupling means is further defined as a parallelogram linkage enabling relative motion between said transducer support means third tool support platform in a direction parallel to said translating direction of said third tool support platform.

18. A machine for making ultrasonic wire bonds on a workpiece comprising;
  a. positioning means for translating an ultrasonic bonding tool to thereby position the tip of the tool to precisely pre-determinable positions relative to a workpiece,
  b. transducer support means for supporting an ultrasonic transducer,
  c. an ultrasonic transducer,
  d. an ultrasonic bonding tool mechanically coupled to said ultrasonic transducer, said bonding tool having therethrough an elongated bore for receiving a bonding wire, said tool having in an upper transverse end thereof an upper wire entrance opening communicating with said bore, and a lower transverse end having thereat a working face in which is located a lower wire exit opening communicating with said bore,
  e. linkage means joining said transducer support means to said positioning means, and
  f. wire manipulating means for manipulating a length of bonding wire threaded through said bore of said bonding tool, said wire manipulating means comprising;
    (I) means for gripping said bonding wire at a location between said upper entrance opening of said bonding tool bore and a wire supply spool,
    (Ii) means for advancing said wire through said bore of said bonding tool to thereby position an end of said wire a pre-determined protrusion distance from said bonding tool tip,
    (Iii) means for forming at said protruding end of said wire a fusion ball, said means being spaced a pre-determined distance from said protruding end of said bonding wire and
    (Iv) means for exerting a rearwardly directed tension force on a portion of said wire rearward of said entrance opening of said bonding tool, whereby said wire is pulled inwardly in said bonding tool a bore to thereby seat said fusion ball against said lower working face of said bonding tool.

19. The machine of claim 18 wherein said means for gripping said bonding wire is further defined as being a remotely actuable clamp having a pair of opposed releasably closeable.

20. The machine of claim 19 wherein said means for advancing said wire through said bore of said bonding tool is further defined as comprising in combination said clamp, a pivotable clamp support platform supporting said clamp, and clamp support platform actuator means, said clamp support platform being pivotably mounted to said transducer support means upstream of said entrance opening of said bore of said bonding tool, whereby said clamp support platform and clamp is pivoted, in response to remote energization of said actuator means, a pre-determined distance away from said entrance opening with said clamp jaws open, said clamp jaws closed on a wire length between a wire supply spool and said entrance opening, and said platform pivoted forward to thereby advance said wire a pre-determined distance through said bore of said bonding tool.

21. The machine of claim 19 wherein said means for forming a fusion ball at said end of said wire protruding a pre-determined distance from said tip of said bonding tool is further defined as comprising in combination;

a. an electrode pivotable from a stowed position to a pre-determined active position longitudinally aligned with and spaced axially away from said tip of said bonding tool, and b. means for discharging an electrical spark from a tip of said electrode to the tip of said wire protruding from said tool tip.

22. The machine of claim 21 wherein said means for exerting a rearwardly directed tension force on a length of said wire rearward of said entrance opening of said bonding wire is further defined as being a drag element fixed to said clamp support platform and frictionally contactable with said wire length, whereby when said clamp jaws are opened and said clamp support platform pivoted rearwardly away from said entrance opening of said bonding tool bore to an inactive position, said drag element exerts a rearwardly directed frictional force on said wire length to thereby seat said fusion ball formed at said protruding end of said wire against said lower face of said bonding tool.

23. The machine of claim 22 wherein said drag element is further defined as being a drag tube fixed to said pivotable clamp support platform, said tube receiving therethrough said length of bonding wire.

24. The machine of claim 23 wherein said drag tube is further defined as having a first, lower portion axially aligned with said upper entrance opening of said bonding tool bore, and a second, upper portion which angles upwardly and rearwardly toward a wire supply spool, and a third, intermediate portion which joins said first and second portion, said intermediate portion being arcuately curved to a bend radius which is effective in producing a friction drag force on wire moving through the bend of said drag tube, without bending said wire beyond it elastic limit.

25. The machine of claim 20 wherein said linkage means joining said transducer support means to said positioning means is further defined as a plurality of pivotably joined bar members defining a parallelogram coupled at one side thereof to a vertically translatable member of said positioning means, and at an opposite side thereof to said transducer support means, whereby said transducer support means is movable in an upward direction when said vertically translatable member of said positioning means is moved downward to press said bonding tool tip against a work site.

26. The machine of claim 25 wherein said clamp support actuator means comprises in combination a motor driven, fore-and-aft reciprocable push bar located off of said transducer support means, and a pushrod reciprocally held by said transducer support means and having at a first, inner end thereof a first, driven bearing urged resiliently against said bar, and at a second, outer end thereof a second, drive bearing resiliently contacted by a rear surface of said pivotable clamp support platform.

* * * * *